(12) United States Patent
Yamamura et al.

(10) Patent No.: US 6,685,869 B2
(45) Date of Patent: Feb. 3, 2004

(54) RESIN COMPOSITION AND THREE-DIMENSIONAL OBJECT

(75) Inventors: Tetsuya Yamamura, Ibaraki (JP); Takayoshi Tanabe, Ibaraki (JP); Takashi Ukachi, Ibaraki (JP)

(73) Assignees: DSM N.V., Heerlen (NL); JSR Corporation, Tokyo (JP); Japan Fine Coatings Co. Ltd., Tokyo (JP)

( * ) Notice: Subject to any disclaimer, the term of this patent is extended or adjusted under 35 U.S.C. 154(b) by 0 days.

(21) Appl. No.: 10/157,034

(22) Filed: May 30, 2002

(65) Prior Publication Data

US 2003/0059708 A1 Mar. 27, 2003

Related U.S. Application Data

(63) Continuation of application No. PCT/NL01/00436, filed on Jun. 7, 2001.

(30) Foreign Application Priority Data

| Jun. 9, 2000 | (JP) | 2000-174115 |
| Aug. 17, 2000 | (JP) | 2000-247709 |
| Oct. 6, 2000 | (JP) | 2000-307924 |

(51) Int. Cl.$^7$ ............ G03C 9/08; B29C 35/04
(52) U.S. Cl. ........ 264/401; 430/269; 430/208.1
(58) Field of Search .............. 430/269, 280.1; 522/129; 264/401

(56) References Cited

U.S. PATENT DOCUMENTS

| 4,942,001 A | * | 7/1990 | Murphy et al. ............ 264/401 |
| 5,453,340 A | | 9/1995 | Kawabata et al. |
| 5,874,041 A | * | 2/1999 | Matsumura et al. ........ 264/401 |
| 6,010,823 A | | 1/2000 | Goto et al. |
| 6,036,910 A | * | 3/2000 | Tamura et al. ............ 264/401 |
| 6,096,796 A | * | 8/2000 | Watanabe et al. .......... 522/100 |
| 6,127,085 A | | 10/2000 | Yamamura et al. |
| 6,287,745 B1 | * | 9/2001 | Yamamura et al. ........ 430/269 |

FOREIGN PATENT DOCUMENTS

| WO | 00/63272 | 4/2000 |
| WO | WO 00/63272 | * 10/2000 |

OTHER PUBLICATIONS

US 2002/0012754 A1, Yamamura et al., Jan. 31, 2002.*
US 2002/0048717 A1, Yamamura et al., Apr. 25, 2002.*

* cited by examiner

*Primary Examiner*—Susan W. Berman
(74) *Attorney, Agent, or Firm*—Pillsbury Winthrop LLP

(57) ABSTRACT

A photocurable resin composition suitable for use in three-dimensional photofabrication comprising (A) a cationically polymerizable organic compound, (B) a cationic photoinitiator, and (C) a (co)polymer obtainable by (co) polymerization of monomers comprising at least one (meth) acrylate-group comprising monomer.

A process for producing a three-dimensional object which comprises the use of a washing agent having a Hansen-solubility between 27–35 $(Mpa)^{1/2}$.

14 Claims, 2 Drawing Sheets

[Figure 1]
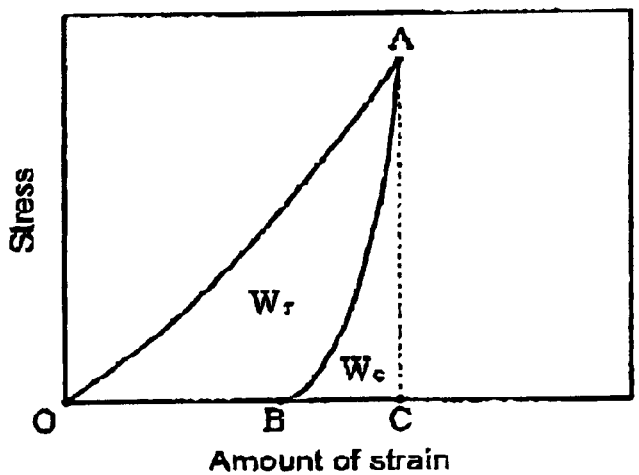
[Figure 2]
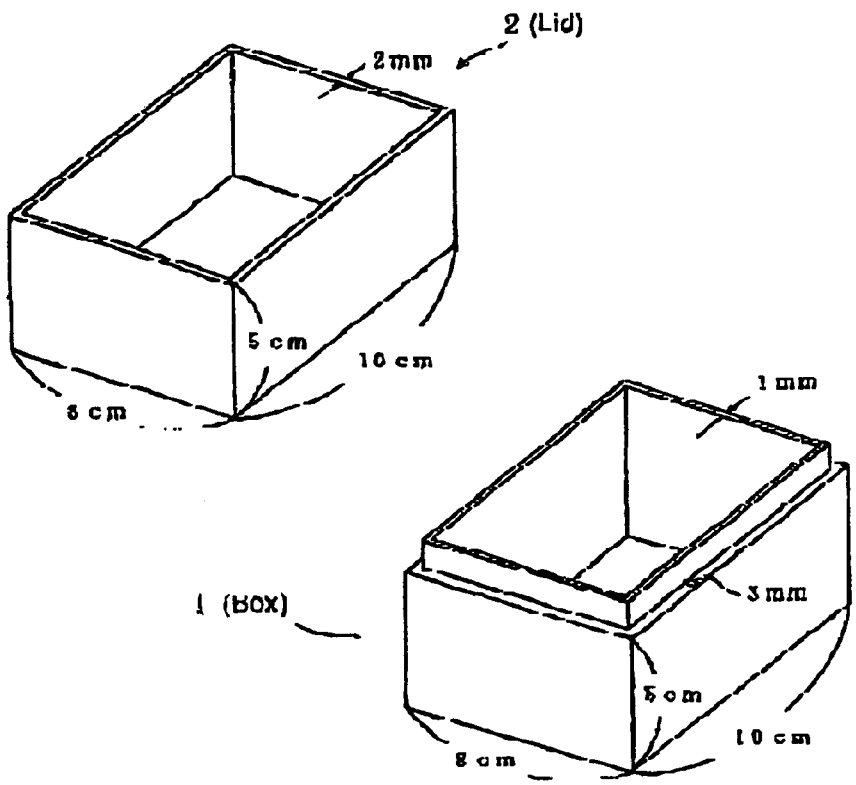

[Figure 3]
(1)
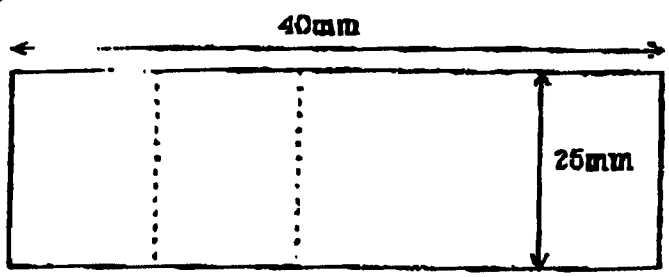
(2)
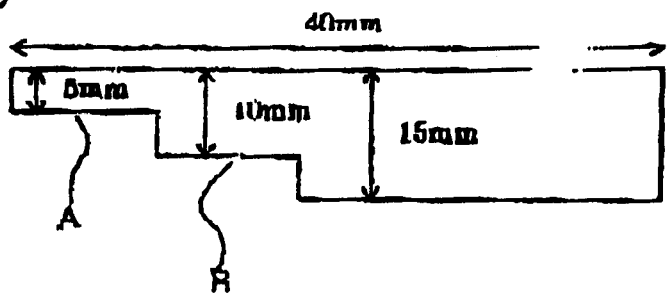

RESIN COMPOSITION AND THREE-DIMENSIONAL OBJECT

This is a Continuation of International Application No. PCT/NL01/00436 filed Jun. 7, 2001, which designated the U.S.

FIELD OF THE INVENTION

The present invention relates to a photocurable resin composition used in three dimensional photofabrication, a process for making a three-dimensional object and the resulting three-dimensional object.

In recent years, photofabrication of three-dimensional objects made from cured resin layers integrally laminated by repeating a step of selectively irradiating a photocurable resin composition has been proposed (see Japanese Patent Application Laid-open No. 247515/1985, U.S. Pat. No. 4,576,330 (Japanese Patent Application Laid-open No. 35966/1987), Japanese Patent Application Laid-open No. 101408/1987, and Japanese Patent Application Laid-open No 24119/1993).

A typical example of such photofabrication is as follows. The surface of a photocurable resin composition (a liquid material) in a vessel is selectively irradiated with light from an ultraviolet laser and the like based on CAD data to form a cured resin layer having a specified pattern. The equivalent of one layer of a resin composition is provided over this cured resin layer and the liquid surface is selectively irradiated to form a new cured resin layer integrally laminated over the cured resin layer. This step is repeated a certain number of times using the same or different irradiating patterns to obtain a three-dimensional object consisting of integrally laminated cured resin layers. The object preferably is washed with a washing agent to remove excess resin sticking to the surface of the object, and the object preferably is postcured by for example UV or heat to further improve the mechanical properties of the object. This photofabrication has attracted considerable attention because a three-dimensional object having a complicated shape can be easily formed in a short period of time.

The prior art discloses a number of resin compositions that can be used for this process. Examples of photocurable resin composition used in the photofabrication of three-dimensional objects are the following resin compositions (1) to (4).

(1) A resin composition comprising a radically polymerizable organic compound such as urethane (meth)acrylate, oligoester (meth)acrylate, epoxy (meth)acrylate, thiol compound, ene compound, and photosensitive polyimide (see, for example, Japanese Patent Applications Laid-open Nos. 204915/1989, 208305/1990, and 160013/1991).

(2) A resin composition comprising a cationically polymerizable organic compound such as an epoxy compound, cyclic ether compound, cyclic lactone compound, cyclic acetal compound, cyclic thioether compound, spiro orthoester compound, and vinyl ether compound (see, for example, Japanese Patent Application Laid-open No. 213304/1989).

(3) A resin composition comprising both a radically polymerizable organic compound and a cationically polymerizable organic compound (see, for example, Japanese Patent Applications Laid-open Nos. 28261/1990, 75618/1990, and 228413/1994).

(4) A resin composition comprising a cationically polymerizable organic compound, a radically polymerizable organic compound (an ethylenically unsaturated monomer), a polyether, polyol compound, and elastomer particles (see, for example, Japanese Patent Application Laid-open No. 310626/1999.

A number of problems exists with the resin compositions disclosed in the prior art or with the application of these resin compositions in a process for making three dimensional objects. One problem with conventionally known resin compositions such as the above resins (1) to (4) is formation of bubbles when the resin composition is supplied onto a cured resin layer (by a coating operation or leveling operation by means of squeezing) or when the resin composition is circulated by a pump or agitated in a container. The bubbles may remain in the formed three-dimensional articles without being destroyed.

The bubbles remaining in the formed three-dimensional articles do not only impair external appearance of the three-dimensional articles, but also remarkably weaken the mechanical strength because the stress is concentrated in the area where the bubbles are present.

Addition of a silicone compound to the resin composition can be one way of overcoming the problem of formation and existence of bubbles. The silicone compound may decrease the surface tension of the resin composition and may destroy the bubbles.

However, a resin composition comprising a compound having an effect of destroying bubbles such as a silicone compound (hereinafter referred to as "defoaming agent") may cause uneven coating when supplied (coated) onto a cured resin layer due to repelling. It is impossible to obtain a uniform thin coating layer on the surface of a cured resin layer using such a resin composition.

No resin compositions which can form three-dimensional articles free from remaining bubbles and exhibits excellent coatability have conventionally been known.

Another problem of the compositions of the prior art is that they tend to absorb water depending on the specific conditions of the environment. Absorption of water may have large consequences for for example viscosity of the resin and thereby for the process of making the three dimensional objects.

Another problem of the compositions and process known in the art is the application of washing agents to remove excessive solvent. Washing agents like for example ethanol tend to be absorbed into the object, causing swelling and deformation of the object and a significantly decrease of the strength of the photofabricated product. Such phenomena tend to occur especially when the photofabricated product is washed with a thin portion of solvent.

The disadvantage of absorption of solvent by the three-dimensional object is especially pronounced when the objects are treated that have a high rubber elasticity. Examples of compositions that may be used to make such objects having high rubber elasticity can be found in for example Japanese Patent Application No. 97433/1999 and No. 165103/1999, which are incorporated herein by reference. The present inventors have found that liquid resins adhering to the surface of a photofabricated product cannot be completely removed using a washing agent containing water as a major component (see Japanese Patent Application No. 111529/1990). This is because liquid resins cannot be dissolved or dispersed in a washing agent containing water as a major component.

As described above, a washing agent which causes a photofabricated product (cured resin) to swell to a very low degree and exhibits good washing performance for liquid resins (uncured resins) has not yet been proposed.

OBJECTS OF THE INVENTION

The present invention has been achieved in view of the above situation.

A first object or the present invention is to provide a photocurable resin composition suitable for use in a stereolithography process in which the bubbles produced during handling or processing of the resin composition are destroyed in a short period of time and which not only can form a three-dimensional object free from residual bubbles, but also exhibits excellent coatability without repelling (without producing defective coating) and can form a uniform thin coating layer on the surface of the cured resin layer.

A second object of the present invention is to provide a three-dimensional object containing no residual bubbles, exhibiting superior external appearance, and possessing excellent mechanical strength.

A further object of the present invention is to provide a photocurable resin composition which can be fabricated into three-dimensional objects with desired properties (interlayer adhesion and fabrication accuracy) under the constant fabricating conditions in a stable manner without any substantial change in the fabricating characteristics (curing depth) after having been stored for a long time under normal use conditions (10–30° C., 20–80% RH).

Still another object of the present invention is to provide an improved stereolithography process which uses in a washing step a washing agent which is capable of completely removing uncured liquid resins adhering to the surface of a photofabricated product and which washing agent neither causes the photofabricated product to be deformed nor decreases the strength of the photofabricated product.

MEANS FOR SOLVING THE PROBLEMS

As a result of extensive studies to achieve the above objects, the inventors of the present invention have found that a photocurable resin composition prepared by adding a copolymer, which is obtained by copolymerizing specific (meth)acrylate monomers, to a resin composition containing a cationically polymerizable organic compound and a cationic photoinitiator, as essential components, exhibits excellent coatability and can produce three-dimensional objects which are free from residual bubbles.

The resin composition of the present invention used in three-dimensional photofabrication comprises: (A) a cationically polymerizable organic compound, (B) a cationic photoinitiator, and (C) a (co)polymer obtainable by (co)polymerization of monomers comprising at least one (meth)acrylate-group comprising monomer.

The (co)polymer of the component (C) includes homopolymers obtainable of a single (meth)acrylate-group containing monomer, copolymers obtainable from two or more (meth)acrylates-group containing monomers, and copolymers made from one or more (meth)acrylates-group containing monomers and one or more other monomers that are copolymerizable with the (meth)acrylate-group containing monomer(s).

BRIEF DESCRIPTION OF THE DRAWINGS

FIG. 1 is a chart showing an example of a stress-strain curve measured using a ultra-micro hardness tester.

FIG. 2 is a perspective view showing photofabricated products in Fabrication Examples 1 and 2.

FIGS. 3(1) and 3(2) are, respectively, a plane view and a cross-section showing the configuration and dimensions of a three-dimensional object for evaluating interlayer adhesion and fabrication accuracy. A and B in FIG. 1 represent overhanging parts.

PREFERRED EMBODIMENTS OF THE INVENTION

The present invention will be described in more detail below.

Component (A)

The component (A) of the radiation curable composition of the present invention (a cationically polymerizable organic compound) is an organic compound which polymerizes or crosslinks by irradiation in the presence of a cationic photopolymerization initiator.

Examples of organic compounds used as the component (A) include an epoxy compound, oxetanyl group-containing compound, oxorane compound, cyclic acetal compound, cyclic lactone compound, thiirane compound, thiethane compound, vinyl ether compound, spiro orthoester compound which is a reaction product of an epoxy compound and lactone, ethylenically unsaturated compound, cyclic ether compound, cyclic thioether compound, vinyl compound, and the like.

(1) Epoxy Compound

As the epoxy compound used as the component (A), cyclohexeneoxide group-containing compounds and glycidyl group-containing compounds are preferable.

The cyclohexeneoxide group-containing compounds exhibit superior cationic polymerizability. Glycidyl group-containing compounds provide a polymer with flexibility and increase the mobility of the polymerization system, thereby improving curability.

Examples of cyclohexeneoxide group-containing compounds suitably used as the component (A) are 3,4-epoxycyclohexylmethyl-3',4'-epoxycyclohexane carboxylate, 2-(3,4-epoxycyclohexyl-5,5-spiro-3,4-epoxy) cyclohexane-m-dioxane, bis(3,4-epoxycyclohexylmethyl) adipate, bis(3,4-epoxy-6-methylcyclohexylmethyl)adipate, 3,4-epoxy-6-methylcyclohexyl-3',4'-epoxy-6'-methyl-cyclohexane carboxylate, methylenebis(3,4-epoxycyclohexane), epoxy-6'-methyl-cyclohexane carboxylate, methylenebis(3,4-epoxycyclohexane), ethylene glycol di(3,4-epoxycyclohexylmethyl)ether, ethylenebis(3, 4-epoxycyclohexanecarboxylate), α-caprolactone-modified 3,4-epoxycyclohexylmethyl-3',4'-epoxycyclohexane carboxylate, trimethylcaprolactone-modified-3,4-epoxycyclohexylmethyl-3',4'-epoxycyclohexane carboxylate, β-methyl-δ-valerolactone-modified-3,4-epoxycyclohexyl-methyl-3',4'-epoxycyclohexane carboxylate.

Of these compounds, 3,4-epoxycyclohexylmethyl-3',4'-epoxycyclohexane-carboxylate, bis(3,4-epoxycyclohexylmethyl)adipate, α-caprolactone-modified 3,4-epoxycyclohexylmethyl-3',4'-epoxycyclohexanecarboxylate, trimethylcaprolactone-modified 3,4-epoxycyclohexylmethyl-3',4'-epoxycyclohexanecarboxylate, and β-methyl-δ-valerolactone-modified 3,4-epoxycyclohexylmethyl-3',4'-epoxycyclohexanecarboxylate are preferable, 3,4-epoxycyclohexylmethyl-3',4'-epoxycyclohexanecarboxylate and bis(3,4-epoxycyclohexylmethyl)adipate are particularly preferable.

Examples of commercially available products of cyclohexeneoxide group containing compounds are UVR-6100, UVR-6105, UVR-6110, UVR 6128, UVR 6199, UVR-6200, UVR-6216 (manufactured by Union Carbide Corp.), Celoxide 2021, Celoxide 2021P, Celoxide 2081, Celoxide 2083, Celoxide 2085, Epolead GT-300, Epolead GT-301, Epolead GT-302, Epolead GT-400, Epolead 401, Epolead 403 (manufactured by Daicel Chemical Industries, Ltd.), KRM-2100, KRM-2110 and KRM-2199 (manufactured by Asahi Denka Kogyo Co., Ltd.).

Examples of the glycidyl group-containing epoxy compounds suitably used as the component (A) include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 1,4 butanediol diglycidyl ether, 1,6-hexanediol diglycidyl ether, glycerol triglycidyl ether, trimethylolpropane triglycidyl ether, polyethylene glycol diglycidyl ether, polypropylene glycol diglycidyl ether; polydiglycidyl ethers of polyether polyols obtained by the addition of one or more alkylene oxides to aliphatic polyhydric alcohols such as ethylene glycol, propylene glycol, and glycerol; diglycidyl esters of aliphatic long-chain dibasic acids; monodiglycidyl ethers of aliphatic higher alcohols; monodiglycidyl ethers of phenol, cresol, butyl phenol, or polyether alcohols obtained by the addition of alkylene oxide to these compounds and glycidyl esters of higher fatty acids. These compounds may be used either individually or in combinations of two or more.

Of these compounds, bisphenol A diglycidyl ether, bisphenol F diglycidyl other, hydrogenated bisphenol A diglycidyl ether, hydrogenated bisphenol 1-diglycidyl ether, 1,4-butanediol diglycidyl ether, 1,6-hexanediol diglycidyl ether, glycerol triglycidyl ether, trimethylolpropane triglycidyl ether, neopentyl glycol diglycidyl ether, polyethylene glycol diglycidyl ether, and polypropylene glycol diglycidyl ether are preferable.

Examples of commercially available products suitably used as the glycidyl group-containing compounds are Epolite 1600 (manufactured by Kyoelsha Chemical Co., Ltd.), UVR-6216 (manufactured by Union Carbide Corp.), Glycidole, AOEX24, Cyclomer A200 (manufactured by Daicel Chemical Industries, Ltd.), Epicoat 828, Epicoat 812, Epicoat 1031, Epicoat A872, Epicoat C1508 (manufactured by Yuka-Shell K.K,), KRM-2400, KRM-2410, KRM-2408, KRM-2490, KRM-2720 and KRM 2750 (manufactured by Asahi Denka Kogyo Co., Ltd.).

(2) Oxetanyl Group-containing Compound

Component A of the composition of the present invention may comprise oxetanyl group containing compounds. These compounds comprise one or more oxetane rings.

The following compounds can be given as examples of oxetane compounds having one oxetane ring in the molecule, 3-ethyl-3-hydroxymethyloxetane, 3-(meth)allyloxymethyl-3-ethyloxetane, (3-ethyl-3-oxetanylmethoxy)methylbenzen, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl(3-ethyl-3-oxetanylmethyl)ether, isobomyloxyethyl(3-ethyl-3-oxetanylmethyl)ether, isobomyl(3 ethyl 3 oxetanylmethyl) ether, 2-ethylhexyl(3-ethyl-3-oxetanylmethyl)ether, ethyldiethylene glycol(3-ethyl-3-oxetanylmethyl)ether, dicyclopentadiene(3-ethyl-3-oxetanylmethyl)ether, dicyclopentenyloxyethyl(3-ethyl-3-oxetanyl methyl)ether, dicyclopentenyl(3-ethyl-3-oxetanylmethyl)ether, tetrahydrofurfuryl(3-ethyl-3-oxetanylmethyl)ether, tetrabromophenyl(3-ethyl-3-oxetanylmethyl)ether, 2-tetrabromophenoxyethyl(3-ethyl-3-oxetanylmethyl)ether, tribromophenyl(3-ethyl-3-oxetanylmethyl)ether, 2-tribromophenoxyethyl(3-ethyl-3-oxetanylmethyl)ether, 2-hydroxyethyl(3-ethyl-3-oxetanyl methyl)ether, 2-hydroxypropyl(3 ethyl 3 oxetanylmethyl)ether, butoxyethyl(3-ethyl-3-oxetanylmethyl)ether, pentachlorophenyl(3-ethyl-3-oxetanylmethyl)ether, pentabromphenyl(3-ethyl-3-oxetanylmethyl)ether, bornyl (3-ethyl-3-oxetanylmethyl)ether, and the like.

Examples of compounds having two or more oxetane rings in the molecule are 3,7-bis(3-oxetanyl)-5-oxa-nonane, 3,3'-(1,3-(2-methylenyl)propanediylbis(oxymethylene))bis-(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methy]propane, ethylene glycol bis(3-ethyl-3-oxetanylmethyl)ether, dicyclopentenyl bis(3-ethyl-3oxetanylmethyl)ether, triethylene glycol bis(3-ethyl-3oxetanylmethyl)ether, tetraethylene glycol bis(3-ethyl-3-oxetanylmethyl)ether, tricyclodecanediyldimethylene(3-ethyl-3-oxetanylmethyl) ether, trimethylolpropane tris(3-ethyl-3-oxetanylmethyl) ether, 1,4-bis(3-ethyl-3-oxetanylmethoxy)butane, 1,6-bis(3 ethyl 3 oxetanylmethoxy)hexane, pentaerythritol tris(3-ethyl-3-oxetanylmethyl)ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanylmethyl)ether, caprolactone-modified dipentaerythritol hexakis(3-ethyl-3-oxetanylmethyl)ether, caprolactone-modified dipentaerythritol pentakis(3-ethyl-3-oxetanylmethyl)ether, ditrimethylolpropane tetrakis(3-ethyl-3-oxetanylmethyl)ether, EO-modified bisphenol A bis (3-ethyl-3-oxetanylmethyl)ether, PO-modified bisphenol A bis(3-ethyl-3-oxetanylmethyl)ether, EO-modified hydrogenated bisphenol A bis(3-ethyl-3-oxetanylmethyl)ether, PO-modified hydrogenated bisphenol A bis(3-ethyl-3-oxetanylmethyl)ether, EO-modified bisphenol F (3-ethyl-3-oxetanylmethyl)ether, and the like.

These compounds may be used either individually or in combination of two or more as the component (A).

Of the above compounds, oxetane compounds having 1–10, preferably 1–4, and particularly preferably two oxetane rings in the molecule are suitable as the component (A). Specifically, (3-ethyl-3-oxetanylmethoxy)methylbenzene, 1,4-bis[(3-ethyl-3-oxetanylmethoxy)methyl]benzene, 1,2-bis(3-ethyl-3-oxetanylmethoxy)ethane and trimethylolpropane tris(3-ethyl-3-oxetanylmethyl)ether are preferably used.

(3) Other Cationically Polymerizable Organic Compounds

Tetrahydrofuran, 2,3-dimethyltetrahydrofuran, and the like can be given as examples or oxolane compounds used as component A.

Trioxane, 1,3-dioxolane, 1,3,6-trioxanecycloctane, and the like can be given as examples of cyclic acetal compounds used as component A. As examples of cycliciactone compounds used as component A, β-propyolactone, a-caprolactone, and the like can be given.

As examples of thiirane compounds used as component A, ethylene sulfide, 1,2-propylene sulfide, thioepichlorohydrin, and the like can be given.

As examples of thietane compounds used as component A, 3,3-dimethylthletane and the like can be given.

As examples of vinyl compounds used as component A, ethylene glycol divinyl ether, triethylene glycol divinyl eithter, trimethylpropane trivinyl ether, and the like can be given.

As examples of ethylenically unsaturated compounds used as component A, vinyl cyclohexane, isobutylene, polybutylene, and the like can be given.

The amount of the component (A) used in the resin composition of the present invention is usually 20–99 wt %, preferably 25–95 wt %, and still more preferably 30–90 wt %.

If the amount of the component (A) is too small, not only three-dimensional object formed from the resin composition may exhibit insufficient dimensional accuracy, but also the three-dimensional objects may deform over time.

Component (B)

The component (B) (cationic photopolymerization initiator) of the resin composition of the present invention is a compound which generates a substance to initiate cationic photopolymerization of the component (A) when irradiated with light. The energy ray such as light used herein refers to visible light, ultraviolet light, infrared light, X-rays, α-rays, β-rays, γ-rays, and the like.

As an example of the component (B), an onium salt having the structure shown by the following formula (1) can be given.

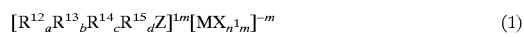

$$[R^{12}{}_aR^{13}{}_bR^{14}{}_cR^{15}{}_dZ]^{+m}[MX_n{}^1{}_m]^{-m} \quad (1)$$

wherein the cation is an onium ion; Z is S, Se, Te, P, As, Sb, Bi, O, I, Br, Cl, or N≡N; $R^{12}$, $R^{13}$, $R^{14}$, and $R^{15}$ are the same or different organic groups a, b, c, and d are integers from 0 to 3, provided that (a+b+c+d) is equal to the valence of Z; M is a metal or a metalloid which constitutes the center atom of the halide complex $[MX_n{}^1{}_m]$, for example, M is B, P, As, Sb, Fe, Sn, Bi, Al, Ca, In, Ti, Zn, Sc, V, Cr, Mn, Co, or the like, and X is a halogen atom such as F, Cl, or Br; m is a net charge of a halide complex ion; and n is a valence of M. The onium salt liberates a Lewis acid upon exposure to light In the formula (1), as specific examples of the onium ion, diphenyliodonium, 4-methoxydiphenyliodonium, bis(4-methylphenyl)iodonium, bis(4-tert-butylphenyl)iodonium, bis(dodecylphenyl)iodonium, triphenylsulfonium, diphenyl-4-thiophenoxyphenylsulfonium, bis[4-(diphenylsulfonio-phenyl]sulfide, bis[4-(di(4-(2-hydroxyethyl)phenyl) sulfonio)phenyl]sulfide, $\eta^5$-2,4-(cyclopentadienyl)[1,2,3,4,5,6-$\eta$]-(methylethyl)-benzene]-iron(1+), and the like can be given.

As specific examples of an anion $[MX_{n+m}]$ in the formula (1), tetrafluoroborate ($BF_4^-$), hexafluorophosphate ($PF_6^-$), hexafluoroantimonate ($SbF_6^-$), hexafluoroarsenate ($AsF_6^-$), hexachloroantimonate ($SbCl_6^-$), and the like can be given.

Onium salts having an anion represented by $[MX_n(OH)^-]$ can be used. Moreover, onium salts having other anions such as a perchloric acid ion ($ClO_4^-$), trifluoromethanesulfonic acid ion ($CF_3SO_3^-$), fluorosulfonic acid ion ($FSO_a^-$), toluenesulfonic acid ion, trinitrobenzenesulfonic acid anion, and trinitrotoluenesulfonic acid anion can be also given as examples.

Of these onium silts, aromatic onium salts arc particularly effective as the photo acid generator of the component (C). For example, aromatic halonium salts disclosed in Japanese Patent Application Laid-open Nos. 151996/1975 and 158680/1975, VIA group aromatic onium salts disclosed in Japanese Patent Application Laid-open Nos. 151997/1975, 30899/1977, 55420/1981, and 125105/1980, VA group aromatic onium salts disclosed in Japanese Patent Application Laid-open No. 158698/1975, oxosulfoxonium salts disclosed in Japanese Patent Application Laid-open Nos. 8428/1981, 149402/1981, and 192429/1982, aromatic diazonium salts disclosed in Japanese Patent Application Laid open No. 17040/1974, thiopyrylium salts disclosed in U.S. Pat. No. 4,139,655, and the like are preferable. In addition, iron/allene complex initiators, aluminum complex/photolysis silicon compound initiators, and the like can also be given as examples.

As examples of commercially available products of photo acid generators suitably used as the component (C), UVI-6950, UVI-6970, UVI-6974, UVI-6990 (manufactured by Union Carbide Corp.), Adekaoptomer SP-150, SP-151, SP-170, SP-172 (manufactured by Asahi Denka Kogyo Co., Ltd.), Irgacure 261 (manufactured by Ciba Specialty Chemicals Co., Ltd.), CI-2481, CI-2624, CI-2639, CI-2064 (manufactured by Nippon Soda Co., Ltd.), CD-1010, CD-1011, CD-1012 (manufactured by Sartomer Co., Ltd.), DTS-102, DTS-103, NAT-103, NDS-103, TPS-103, MDS-103, MPI-103, BBI-103 (manufactured by Midori Chemical Co., Ltd.), PCI-061T, PCI-062T, PCI-020T, PCI-022T (manufactured by Nippon Kayaku Co., Ltd.), and the like can be given. Of these, UVI-6970, UVI-6974, Adekaoptomer SP-170, SP-172, CD-1012, and MPI-103 are particularly preferred for providing the resin composition with higher photocuring sensitivity.

These photo acid generators can be used either individually or in combination of two or more as the component (B).

The amount of the component (B) used in the resin composition of the present invention is usually 0.1–10 wt %, preferably 0.2–6 wt %, and still more preferably 0.3–5 wt %, relative to the total weight of the composition.

If the amount of the component (B) is too small, photocurability of the resulting resin composition decreases, making it impossible to fabricate a three-dimensional object exhibiting sufficient mechanical strength. On the other hand, if the amount is too great, it becomes difficult to control cure depth of the resulting resin composition when used for photofabrication due to the insufficient phototransmission, whereby the resulting three-dimensional objects may exhibit insufficient fabrication accuracy.

Component (C)

The component (C) used in the resin composition of the present invention is a (co)polymer obtainable by (co) polymerizing a monomer comprising at least one (meth) acrylate group or a mixture of monomers comprising at least one monomer comprising a (meth)acrylate group. Specifically, the component (C) may be one or more of (co)polymers selected from (1) a homopolymer of a (meth) acrylate group containing monomer, (2) a copolymer made from two or more (meth)acrylates group containing monomers, and (3) a copolymer made from one or more (meth)acrylates group containing monomers and one or more other monomers copolymerizable with the (meth) acrylate group containing monomer.

Of those (co)polymers, (1) a homopolymer of a (meth) acrylate group containing monomer and (2) a copolymer made from two or more (meth)acrylate group containing monomers are preferable.

Given as examples of (meth)acrylic esters suitable as the component (C) in the present invention are n-propyl (meth) acrylate, n-butyl (meth)acrylate, i-butyl (meth)acrylate, sec-butyl (meth)acrylate, tert-butyl (meth)acrylate, n-aminohexyl (meth)acrylate, 2-heptyl (meth)acrylate, octyl (meth)acrylate, 2-ethylhexyl (meth)acrylate, nonyl (meth) acrylate, decyl (meth)acrylate, dodecyl (meth)acrylate, hexadecyl (meth)acrylate, octadecyl (meth)acrylate, cyclohexyl (meth)acrylate, and phenyl (meth)acrylate. Although these (meth)acrylic acid esters may be used individually, combined use of two or more of them is more preferable. Use of two or more (meth)acrylic acid alkyl esters in combination is particularly preferable.

An ideal combination of the (meth)acrylic acid alkyl esters for preparing component (C) by tho copolymerization of two or more these (meth)acrylic acid alkyl esters is a combination of n-butyl acrylate and 2-ethylhexyl acrylate.

In this instance, the copolymerization molar ratio of n-butyl acrylate and 2-ethylhexyl acrylate is preferably from 1:99 to 99:1, more preferably from 10:90 to 90:10, and particularly preferably from 70:30 to 90:10.

As monomers (copolymerizable monomers) other than (meth)acrylic acid esters for preparing the copolymer of the component (C), vinyl compounds such as for example vinyl acetate, styrene, vinyl chloride, vinylidene chloride, acrylonitrile, vinyl toluene and acrylamide can be given.

The proportion of (meth)acrylic acid esters used for obtaining the component (C) is usually 30–100 mol %, and preferably 100 mol %.

The number average molecular weight (Mn) of the copolymer of the component (C), in terms of a polystyrene reduced number average molecular weight measured by GPC, is preferably in the range of 1,000–500,000, more preferably 1,000–100,000, and particularly preferably 2,000–10,000. The weight average molecular weight (Mw) is preferably 1,000–1,000,000, preferably 1,000–200,000, and particularly preferably 2,000–20,000.

"Polyflow No. 90" (manufactured by Kyoeisha Chemical Co., Ltd.) can be given as commercially available (co) polymer preferably used as the component (C).

Because of inclusion of such a (co)polymer as component (C), the resin composition of the present invention exhibits excellent defoaming properties and can destroy bubbles inevitably produced during fabrication in a very short period of time (e.g. within 60 seconds), thereby preventing bubbles from remaining in the fabricated three-dimensional articles. The resin composition of the present invention not only possesses superior defoaming properties, but also exhibits excellent coatability and can produces a homogeneous thin layer on the surface of any cured resin layers or supporting stages.

The amount of the component (C) used in the resin composition of the present invention is usually 0.001–10 wt %, preferably 0.01–5 wt %, and still more preferably 0.05–3 wt %.

If the content of the component (C) is too small. The resulting resin composition does not have excellent defoaming properties (a short defoaming time). No three-dimensional objects free from remaining bubbles can be obtained from such a resin composition.

On the other hand, if the content of the component (C) is too great, coatability may be impaired due to repelling, making it difficult to form a homogeneous thin layer of the resin composition on a cured resin layer. In addition, adhesion between formed cured layers may be so poor that mechanical properties of the products may be impaired.

Component (D)

The component (D) (ethylenically unsaturated monomer) used as an optional component in the resin composition of the present invention is a compound having an ethylenically unsaturated bond (C=C) in the molecule, and includes monofunctional monomers containing one ethylenically unsaturated bond in one molecule and polyfunctional monomers containing two or more, and preferably three or more ethylenically unsaturated bonds in one molecule.

Examples of monofunctional monomers having one ethylenically unsaturated bond in the molecule include acrylamide, (meth)acryloylmorpholine, 7-amino-3,7-dimethyloctyl (meth)acrylate, isobutoxymethyl(meth) acrylamide, isobomyloxyethyl (meth)acrylate, isobornyl (meth)acrylate, 2-ethylhexyl (meth)acrylate, ethyldiethylene glycol (meth)acrylate, t-octyl (meth)acrylamide, diacetone (meth)acrylamide, dimethylaminoethyl (meth)acrylate, diethylaminoethyl (meth)acrylate, lauryl (meth)acrylate, dicyclopentadiene (meth)acrylate, dicyclopentenyloxyethyl (meth)acrylate, dicyclopentenyl (meth)acrylate, N,N-dimethyl(meth)acrylamide, tetrachlorophenyl (meth) acrylate, 2-tetrachlorophenoxyethyl (meth)acrylate, tetrahydrofurfuryl (meth)acrylate, tetrabromophenyl (meth) acrylate, 2-tetrabromophenoxyethyl (meth)acrylate, 2-trichlorophenoxyethyl (meth)acrylate, tribromophenyl (meth)acrylate, 2-tribromophenoxyethyl (meth)acrylate, 2-hydroxyethyl (meth)acrylate, 2-hydroxypropyl (meth) acrylate, vinylcaprolactam, N-vinylpyrrolidone, phenoxyethyl (meth)acrylate, butoxyethyl (meth)acrylate, pentachlorophenyl (meth)acrylate, pentabromophenyl (meth)acrylate, polyethylene glycol mono(meth)acrylate, polypropylene glycol mono(meth)acrylate, bornyl (meth)acrylate and methyltriethylene diglycol (meth)acrylate, and compounds shown by the following formulas (28)–(30). These compounds may be used either individually or in combination of two or more.

Of these, preferable monofunctional monomers include, but are not limited to, isobomyl (meth)acrylate, lauryl (meth)acrylate, and phenoxyethyl (meth)acrylate are preferable.

As examples of commercially available products of these monofunctional monomers, ARONIX M-101, M-102, M-111, M-113, M-117, M-152, TO-1210 (manufactured by Toagosei Co., Ltd.), KAYARAD TC-110S, R-564, R-128H (manufactured by Nippon Kayaku Co., Ltd.), Viscoat 192, 220, 2311HP, 2000, 2100, 2150, 8F, 17F (manufactured by Osaka Organic Chemical Industry Co., Ltd.), and the like can be given.

Examples of the polyfunctional monomers having two or more ethylenically unsaturated bonds in one molecule include ethylene glycol di(meth)acrylate, dicyclopentenyl di(meth)acrylate, triethylene glycol diacrylate, tetraethylene glycol di(meth)acrylate, tricyclodecanediyldimethylene di(meth)acrylate, tris(2-hydroxyethyl)isocyanurate di(meth) acrylate, tris(2-hydroxyethyl)isocyanurate tri(meth)acrylate, caprolactone-modified tris(2-hydroxyethyl)isocyanurate tri (meth)acrylate, trimethylolpropane tri(meth)acrylate, EO-modified trimethylolpropane tri(meth)acrylate, PO-modified trimethylolpropane tri(meth)acrylate, tripropylene glycol di(meth)acrylate, neopentyl glycol di(meth) acrylate, both terminal (meth)acrylate adduct of bisphenol A diglycidyl ether, 1,4-butanediol di(meth)acrylate, 1,6-hexanediol di(meth)acrylate, pentaerythritol tri(meth) acrylate, pentaerythritol tetra(meth)acrylate, polyester di(meth)acrylate, polyethylene glycol di(meth)acrylate, dipentaerythritol hexa(meth)acrylate, dipentaerythritol penta(meth)acrylate, dipentaerythritol tetra(meth)acrylate, caprolactone-modified dipentaerythritol hexa(meth) acrylate, caprolactone-modified dipentaerythritol penta (meth)acrylate, ditrimethylolpropane tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, EO-modified bisphenol F di(meth)acrylate, (meth)acrylate of phenol novolak polyglycidyl ether, and the like. These are used either individually or in combination of two or more.

Of these polyfunctional monomers, trimethylolpropane tri(meth)acrylate, EO-modified trimethylolpropane tri (meth)acrylate, PO-modified trimethylolpropane tri(meth) acrylate, pentaerythritol tri(meth)acrylate, pentaerythritol tetra(meth)acrylate, dipentaerythritol hexa(meth)acrylate, dipentaerythritol penta(meth)acrylate, dipentaerythritol tetra(meth)acrylate, caprolactone-modified dipentaerythritol hexa(meth)acrylate, caprolactone-modified dipentaerythritol penta(meth)acrylate, ditrimethylolpropane tetra(meth)acrylate, acid and the like are preferable.

As examples of commercially available products of these polyfunctional monomers, SA 1002 (manufactured by Mitsubishi Chemical Corp.), Viscoat 195, 230, 260, 215, 310, 214HP, 295, 300, 360, GPT, 400, 700, 540, 3000, 3700 (manufactured by Osaka Organic Chemical Industry Co., Ltd.), KAYARAD R-526, HDDA, NPGDA, TPGDA, MANDA, R-551, R-712, R-604, R-684, PET-30, GPO-303, TMPTA, THE-330, DPHA, DPHA-2H, DPHA-2C, DPHA-21, D-310, D-330, DPCA-20, DPCA-30, DPCA-60, DPCA-120, DN-0075, DN-2475, T-1420, T-2020, T-2040, TPA-320, TPA-330, RP-1040, RP-2040, R-011, R-300, R-205 (manufactured by Nippon Kayaku (Co., Ltd.), ARONIX M-210, M-220, M-233, M-240, M-215, M-305, M-309, M-310, M-315, M-325, M-400, M-6200, M-6400 (manufactured by Toagosei Co., Ltd.), Lite Acrylate BP-4EA, BP-4PA, BP-2EA, BP-2PA, DCP-A (manufactured by Kyoeisha Chemical Co., Ltd.), New Frontier BPE-4, TEICA, BR-42M, GX-8345 (manufactured by Daiichi Kogyo Seiyaku Co., Ltd.), ASF-400 (manufactured by Nippon Steel Chemical Co., Ltd.), Ripoxy SP-1506, SP-1507, SP-1509, VR-77, SP-4010, SP-4060 (manufactured by Showe Highpolymer Co., Ltd.), NK Eater A-BPE-4 (manufactured by Shin-Nakamura Chemical Co., Ltd.), and the like can be given.

Of these polyfunctional monomers, the above-mentioned tri(meth)acrylate compounds, tetra(meth)acrylate compounds, penta(meth)acrylate compounds, and hexa(meth)acrylate compounds are preferably used. Of these, particularly preferable compounds include, but are not limited to, trimethylolpropane tri(meth)acrylate, EO modified trimethylolpropane tri(meth)acrylate, dipentaerythritol hexa(meth)acrylate, dipentaerythritol penta(meth)acrylate, and ditrimethylolpropane tetra(meth)acrylate.

Each of the above monofunctional and polyfunctional monomers can be used either individually or in combinations of two or more, or in combinations of at least one monofunctional monomer and at least one polyfunctional monomer as the component (D). It is preferable that the component (D) Include 60 wt % or more of the polyfunctional monomers having three or more ethylenically unsaturated bonds in one molecule. The content of the polyfunctional monomers having three or more ethylenically unsaturated bonds is more preferably 70 wt % or more, even more preferably 80 wt % or more, and particularly preferably 100 wt %. If the content of these polyfunctional monomers is less than 60 wt %, photocurability of the resin composition may decrease and the resulting three-dimensional objects tend to exhibit deformation with time.

These polyfunctional monomers having three or more ethylenically unsaturated bonds can be selected from the group consisting of the above-mentioned tri(meth)acrylate compounds, tetra(meth)acrylate compounds, penta(meth)acrylate compounds, and hexa(meth)acrylate compounds. Of these, trimethylolpropane tri(meth)acrylate, EO-modified trimethylolpropane tri(meth)acrylate, dipentaerythritol hexa(meth)acrylate, dipentaerythritol penta(meth)acrylate, and ditrimethylolpropane tetra(meth)acrylate are particularly preferable.

The amount of the component (D) used in the resin composition of the present invention is usually 0–50 wt %, preferably 3–40 wt %, and still more preferably 6–30 wt %.

If the content Is too great, the resulting resin composition may exhibit shrinkage during photocuring and the resulting three-dimensional objects may exhibit insufficient heat resistance and decreased moisture resistance.

Component (E)

The component (E) (A radical polymerizationphotoinitiator) making up the resin composition of the present invention together with the above component (D) is a compound which decomposes and generates radicals by energy rays such as light and initiates the radical polymerization reaction of the component (D) by these radicals. The energy ray such as light used herein refers to visible light, ultraviolet light, infrared light, X-rays, α-rays, β-rays, γ-rays, and the like.

Examples of the radical photoinitiator are acetophenone, acetophenone benzyl ketal, anthraquinone, 1-(4-isopropylphenyl)-2-hydroxy-2-methylpropan-1-one, carbazole, xanthone, 4-chlorobenzophenone, 4,4'-diaminobenzophenone, 1,1-dimethoxydeoxybenzoin, 3,3'-dimethyl-4-methoxybenzophenone, thioxanthone compounds, 2-methyl-1-[4-(methylthio)phenyl]-2-morpholino-propan-2-one, 2-benzyl-2-dimethylamino-1-(4-morpholinophenyl)-butan-1-one, triphenylamine, 2,4,6-trimethylbenzoyldiphenylphosphine oxide, bis(2,6-dimethoxybenzoyl-2,4,4-trimethylpentylphosphine oxide, benzyl dimethyl ketal, 1-hydroxycyclohexyl phenyl ketone, 2-hydroxy-2-methyl-1-phenylpropan-1-one, fluorenone, fluorene, benzaldehyde, benzoin ethyl ether, benzoin propyl ether, benzophenone, Michler's ketone, 3-methylacetophenone, 3,3',4,4'-tetra(t-butylperoxycarbonyl)benzophenone (BTTB), combinations of BTTB and dyesensitizers such as xanthene, thioxanthene, cumarin, and ketocumarin, and the like. Of these, particularly preferable radical photoinitiators are, but not limited to, benzyl dimethyl ketal, 1-hydroxycyclohexylphenyl ketone, 2,4,6-trimethylbenzoyldiphenylphosphine oxide, and 2-benzyl-2-dimethylamino-1-(4-morpholinophenyl)-butan-1-one.

Photosensitizers (polymerization accelerator), reactive diluents, and the like can be added to the photocurable resin composition of the present invention to the extent that the effects of the present invention are not impaired.

As examples of the photosensitizers, amine compounds such as triethanolamine, methyldiethanolamine, triethylamine, and diethylamine, thioxanthone, derivatives of thioxanthone, anthraquinone, derivatives of anthraquinone, anthracene, derivatives of anthracene, perylene, derivatives of perylene, benzophenone, benzoin isopropyl ether, and the like can be given.

The amount of the component (E) used in a resin composition of the present invention is usually 0–15 wt %, preferably 0–10 wt %, and still more preferably 0–8 wt %.

If the content of the component (E) in a resin composition comprising the component (D) is too small, the radical polymerization rate (curing rate) of the resulting resin composition may decrease, whereby the fabrication may require a long period of time or the resolution may be reduced. If the content is too great, an excess amount of the polymerization initiator may decrease the curing characteristics of the resin composition or adversely affect the moisture resistance or heat resistance of the resulting three-dimensional objects.

Component (F)

The component (F) (a polyol compound) which may be used in the resin composition of the present invention as an optional component is useful for providing photocurability to the resin composition as well as form stability (controlling deformation with time) and physical stability (controlling change in mechanical characteristics with time) for the photofabricated three-dimensional objects. The polyol compounds used as the component (F) contain preferably two or more, and still more preferably 2 to 6 hydroxyl groups in the molecule. If a polyol compound containing only one hydroxyl group in one molecule is used, photocurability of the resin composition may not be sufficiently improved, and mechanical characteristics, in particular, the modulus of elasticity of the resulting three-dimensional objects may decrease. If a polyol compound containing more than six hydroxyl groups in one molecule is used, the resulting three-dimensional objects may exhibit insufficient elongation and reduced moisture resistance.

As examples of such polyol compounds, polyether polyols, polycaprolactone polyols, polyester polyols produced by modifying using a polyester made from a dibasic acid and a diol, and the like can be given.

Of these, polyether polyols are preferable. For example, polyether polyols obtained by modifying a polyhydric alcohol containing three or more hydroxyl groups, such as trimethylolpropane, glycerol, pentaerythritol, sorbitol, sucrose, or quadrol, with a cyclic ether compound, such as ethylene oxide (EO), propylene oxide (PO), butylene oxide, or tetrahydrofuran, can be given. Specific examples include EO-modified trimethylolpropane, PO-modified trimethylolpropane, tetrahydrofuran-modified trimethylolpropane, EO-modified glycerol, PO-modified glycerol, tetrahydrofuran-modified glycerol, EO-modified pentaerythritol, PO-modified pentaerythritol, tetrahydrofuran-modified pentaerythritol, EO-modified sorbitol, PO-modified sorbitol, EO-modified sucrose, PO-modified sucrose, EO-modified quadrol, polyoxyethylenediol, polyoxypropylenediol, polyoxytetramethylenediol, polyoxybutylenediol, polyoxybutylene-oxyethylene copolymer diol, and the like. Of these, EO-modified trimethylolpropane, PO-modified trimethylolpropane, PO-modified glycerol, and PO-modified sorbitol are preferable.

As examples of commercially available products of polyether polyols, Sunnix TP 400, GP-1000, SP-750, GP-250, GP-400, GP-600 (manufactured by Sanyo Chemical Industries, Ltd.), TMP-3 Glycol, PNT-4 Glycol, EDA-P-4, EDA-P-8 (manufactured by Nippon Nyukazai Co., Ltd.), G-300, G-400, G-700, T-400, EDP-450, SP600, SC-800 (manufactured by Asahi Denka Kogyo Co., Ltd.), and the like can be given.

As specific examples of the polycaprolactone polyols, caprolactone-modified trimethylolpropane, caprolactone-modified glycerol, caprolactone-modified pentaerythritol, caprolactone-modified sorbitol, and the like can be given.

Examples of commercially available products of polycaprolactone polyols include TONE 0301, TONE 0305, TONE 0310 (manufactured by Union Carbide Corp.), and the like. Examples of commercially available products of polyester polyols include PLACCEL 303, PLACCEL 305, PLACCEL 308 (manufactured by Daicel Chemical Industries, Ltd.), and the like.

These polyol compounds can be used either individually or in combination of two or more.

The molecular weight of the polyether polyol is preferably 100–50,000, and more preferably 160–20,000. If the molecular weight of the polyol used is too small, the three-dimensional objects exhibiting adequate form stability and physical stability cannot be fabricated from the resulting resin composition. If the molecular weight of the polyol is too great, viscosity of the resin composition may increase, giving rise to a decreased modulus of elasticity of the resulting photofabricated three-dimensional objects.

The amount of the component (F) used in the resin composition of the present invention is usually 0.35 wt %, preferably 1–30 wt %, and still more preferably 2–25 wt %.

If the content of the component (F) is too great, photocurability of the resin composition may decrease, thereby reducing the modulus of elasticity of the resulting three-dimensional objects.

Component (G)

The component (G) (elastomer particles with an average particle diameter of 10–700 nm) constituting the resin composition of the present invention as an optional component can provide fabricated three-dimensional objects with excellent impact strength.

Moreover, core-shell type particles produced by coating these elastomer particles with a methyl methacrylate polymer, methyl methacrylate/glycidyl methacrylate copolymer, and the like can also be used. Elastomer particles of the component (G) may have a crosslinking structure. The elastomer particles can be crosslinked by a conventional method. As examples of crosslinking agents used in such a method, divinylbenzene, ethylene glycol di(meth)acrylate, diallylmaleate, triallylcyanurate, triallylisocyanurate, diallylphthalate, trimethylolpropane triacrylate, allyl methacrylate, and the like can be given.

Examples of elastomer particles suitably used as component (G) are elastomer particles containing polybutadiene, polyIsoprene, styrene/butadiene copolymer, styrene/isoprene copolymer, ethylene/propylene copolymer, ethylene/α-olefin copolymer, ethylene/α-olefin/polyene copolymer, acrylic rubber, butadiene/(meth)acrylate copolymer, styrene/butadiene block copolymer, and styrene/isoprene block copolymer as the base component.

Examples of the core-shell type elastomer particles used as the component (G) are elastomer particles in which a core of partially crosslinked polybutadiene, polyisoprene, styrene/butadiene copolymer, styrene/isoprene copolymer, ethylene/propylene copolymer, ethylene/α-olefin copolymer, ethylene/α-olefin/polyene copolymer, acrylic rubber, butadiene/(meth)acrylate copolymer, styrene/butadiene block copolymer or styrene/isoprene block copolymer is coated with a covering layer (shell) of a methyl methacrylate polymer or methyl methacrylate/glycidyl methacrylate copolymer.

The ratio (t/R) of the core radius (R) to the shell thickness (t) of the core-shell type elastomer particles is usually from 1/1000 to 2/1, preferably from 1/200 to 1/1.

Among the above elastomer particles, elastomer particles made from cords of partially crosslinked polybutadiene, polyisoprene, styrene/butadiene copolymer, styrene/isoprene copolymer, butadiene/(meth)acrylate copolymer, styrene/butadiene block copolymer, styrene/isoprene block copolymer, coated with a covering layer (shell) of a methyl methacrylate polymer or methyl methacrylate/glycidyl methacrylate copolymer are particularly preferred These elastomer particles may be prepared by a conventionally known method such as emulsion polymerization. The emulsion polymerization for preparing elastomer particles can be carried out by, for example, (i) polymerizing the all amount of monomer components in one reaction, (ii) polymerizing part of monomer components first and then continuously or intermittently adding the remaining part of the monomer components to polymerize, (iii) polymerizing monomer components while continuously adding the monomer components during polymerization, or (iv) polymerizing monomer components using seed particles.

Elastomer particles of the component (D) have an average particle diameter of 10–700 nm, and preferably 30–300 nm.

If the average particle diameter of elastomer particles is less than 10 nm, the three-dimensional objects fabricated using the resin composition may not have sufficient impact strength and viscosity of the resin composition may be so high that productivity and fabrication accuracy of the three-dimensional objects may be adversely affected. On the other hand, if the average particle diameter of elastomer particles is more than 700 nm, surface smoothness and fabrication accuracy of the three-dimensional objects produced from the resin composition tend to be impaired.

Examples of commercially available products of these core-shell type elastomer particles preferably used as the component (G) are, Reginous Bond RKB (manufactured by Reginous Chemical Industries Co., Ltd.), Techno MBS-61, and MBS-69 (manufactured by Techno Polymer Co., Ltd.).

The amount of the component (G) used in the resin composition of the present invention is usually 0–35 wt %, preferably 3–30 wt %, and still more preferably 4–20 wt %.

On the other hand, if the proportion is too great, three-dimensional objects fabricated from the resin composition may have impaired dimensional accuracy.

Component (H)

A filler (component (H)) may be added to the resin composition of the present invention as an optional component. The filler can provide fabricated three-dimensional objects with superior mechanical characteristics.

The filler used as the component (H) may be either an inorganic filler or organic filler.

As an inorganic filler used as the component (H), either particle inorganic fillers or fibrous inorganic fillers can be used. An average particle diameter of particle inorganic fillers or an average fiber length of fibrous inorganic fillers is in the range of 1–50 $\mu$m, and preferably 3–40 $\mu$m Given as specific examples of such inorganic fillers are aluminum oxide, aluminum hydroxide, diatomite, glass beads, hollow glass beads, magnesium oxide, magnesium hydroxide, magnesium carbonate, silica particles, shirasu baloons, glass fibers, potassium titanate whiskers, carbon whiskers, sapphire whiskers, beryllia whiskers, boron carbide whiskers, silicon carbide whiskers, silicon nitride whiskers, talc, and carbon black. Of these, glass beads, hollow glass beads, silica particles, potassium titanate whiskers, talc, carbon black, and the like are preferable. These inorganic fillers may be used either individually or in combinations of two or more as the component (H).

As organic fillers used in the resin composition of the present invention, cross-linking polystyrene polymer particles, cross-linking polymethacrylate polymer particles, cross-linking styrene/methacrylate copolymer particles, polyethylene polymer particles, polypropylene polymer particles, polybutadiene polymer particles, and phenol resin polymer particles, for example, can be given.

The amount of the component (H) used in the resin composition of the present invention is usually 0–80 wt %, and preferably 0–70 wt %.

Other Optional Components

The resin composition of the present invention may contain optional components other than the above components (A)–(H) insofar as the effect of the present invention is not impaired Examples of such additives include polymers or oligomers such as epoxy resin, polyamide, polyamideimide, polyurethane, polybutadiene, polychloroprene, polyether, polyester, styrene-butadiene block copolymer, petroleum resin, xylene resin, ketone resin, cellulose resin, fluorine-containing oligomer, silicone-containing oligomer, and polysulfide oligomer, polymerization inhibitors such as phenothiazine and 2,6di-t-butyl-4-methylphenol, polymerization initiation adjuvant, leveling agents, wettability improvers, surfactants, plasticizers, UV absorbers, silane coupling agents, pigments, dyes, and the like.

The photocurable resin composition of the present invention can be produced by mixing the above essential components (A), (B), and (C), and optional components (D)–(H) homogeneously together with the other optional components as required.

Viscosity of the resin composition at 25° C. is preferably 60 20,000 cps, and still more preferably 70.10,000 cps.

Some photocurable resin compositions for fabricating three-dimensional objects are stored in a container and dispensed for use over a long period of time, e.g. from several months to several years. The environmental conditions (temperature and humidity) under which these resin compositions are stored and used are not necessarily constant. For this reason, it is desirable that such a photocurable resin composition for fabricating three-dimensional objects have excellent storage stability of a degree that its fabricating characteristics do not change after having been stored for a long period of time under such conditions and can produce three-dimensional objects with desired properties (interlayer adhesion and fabrication accuracy) in a stable manner.

The above resin compositions tend to absorb moisture when stored and used under standard use conditions (23° C., 50%RH) over a long period of time until its water content reaches the equilibrium moisture content under such standard use conditions. The fabrication characteristic of the resin composition, such as a depth of curing, that is the thickness of a cured layer formed, when the composition is exposed to a specific dose of radiation, for example, significantly differ according to the water content of the resin composition before and after storing.

The water content of the resin composition will not change significantly when stored under typical storage and use conditions for a long period of time, if the water content is in the range 0.3–1.5 wt % at the time of preparation of the composition. As a result, fabricating characteristics which depend on the water content of the resin composition, such as the cure depth obtained when a certain amount of light energy is irradiated, will not substantially change during storage. Therefore, three-dimensional objects with desired properties can be produced in a stable manner without changing fabrication conditions.

The amount of water in the resin composition of the present invention at the time of preparation is usually 0.3–1.5 wt %, and preferably 0.5–1.0 wt %.

If the water content at the time of preparation is less than 0.3 wt %, the curing depth significantly decreases as the water content increases with time up to the equilibrium moisture content during store under normal use conditions, particular when stored and used for a long period of time under high humidity environment. If fabricated under the optimum fabrication conditions at the initial stage when the water content is less than 0.3 wt %, peeling may occur between the layers. Three-dimensional objects with a desired properties cannot be produced.

In this instance, when starting fabrication using the resin composition stored for a long time, the addition of water to the resin composition in a vessel attached to the fabricating apparatus, which contains water less than the equilibrium moisture content may be considered. However, this approach is not realistic because it is extremely difficult to determine an appropriate amount of water to be added taking into account various environmental conditions such as humidity. Therefore, it is difficult to maintain a constant water content in the resin composition stored in a container.

On the other hand, if the water content at the time of preparation is more than 1.5 wt %, the curing depth increases as the water content decreases with time down to the equilibrium moisture content during store and use for a long period of time. If fabricated under the optimum fabrication conditions at the initial stage when the water content is more than 1.5 wt %, fabrication accuracy to the lamination direction is impaired. No three-dimensional objects with a desired properties can be obtained.

Furthermore, it is desirable that not only the resin composition of the present invention satisfy the water content in the range of 0.3–1.5 wt % at the time of preparation, but also the water content be 0.5–1.5 times, ideally equivalent to, the equilibrium moisture content under typical use conditions, that is, at a temperature of 23° C. and 50% relative humidity.

In this manner, it is possible to decrease deviation of the water content from the equilibrium moisture content over time, thereby minimizing adverse effects on fabrication characteristics.

Photofabrication of Three-dimensional Objects

The resin composition of the present invention thus obtained can be suitably used as a photocurable resin composition for the photofabrication of three-dimensional objects. Specifically, a fabrication method in which the resin composition of the present invention is provided with energy required for curing by being selectively irradiated with light such as visible light, ultraviolet light, and infrared light can form a three-dimensional object with a desired shape and being free from impaired external appearance due to residual bubbles and inadequate coating.

Various methods can be used as the means for selectively irradiating the resin composition of the present invention without specific limitations. For example, a means of irradiating the composition while scanning with laser beams or focused rays converged by lenses, mirrors, and the like, a means of irradiating the composition with unfocused rays via a mask having a phototransmission area with a specified pattern, a means of irradiating the composition via optical fibers corresponding to a specified pattern of a photoconductive material comprising bundled multiple optical fibers, and the like can be employed. When using a mask, a mask which electrooptically forms a mask image consisting of a phototransmission area and a non-phototransmission area in accordance with a specified pattern by the same principle as that of a liquid crystal display can be used. If minute parts or high dimensional accuracy are required in the objective three-dimensional object, a means of scanning with laser beams with a small spot diameter is preferably employed.

The surface of the resin composition in a vessel to be irradiated (for example, scanning plane of focused rays) may be the liquid surface of the resin composition or the interface between the resin composition and the transparent wall of the vessel. In the latter case, the composition can be irradiated either directly or indirectly via the wall of the vessel.

In the photofabrication of three-dimensional objects, after curing a predetermined area of the resin composition, the cured area is laminated by continuously or gradually moving the irradiation spot (irradiation surface) from the cured area to the uncured area to form an objective three-dimensional object. The irradiation spot can be moved, for example, by moving any one of a light source, the vessel of the resin composition, or the cured area of the resin composition, or by providing additional resin composition to the vessel.

A typical example of the photofabrication is as follows. The resin composition is provided on a support stage capable of moving up and down placed inside the container and is minutely lowered (submerged) to form a thin layer (1) of the resin composition. Even if bubbles are produced when supplying the resin composition, such bubbles can be destroyed in a short period of time (e.g. within 60 seconds) by the defoaming effect exhibited by the component (C).

This thin layer (1) free from bubbles is selectively irradiated to form a solid cured resin layer (1). The liquid resin composition is provided on this cured resin layer (1) to form a thin layer (2) free from bubbles. This thin layer (2) is selectively irradiated to form a cured resin layer (2) integrally laminated with the cured resin layer (1).

This step is repeated for a certain number of times while using either the same or different irradiation patterns to form a three-dimensional object consisting of integrally laminated cured resin layers (n).

The resulting three-dimensional object is then removed from the vessel. Preferably the three-dimensional object is optionally washed. As washing agents, alcohol-type organic solvents such as isopropyl alcohol and ethyl alcohol, ketone-type organic solvents such as acetone, ethyl acetate, and methyl ethyl ketone, aliphatic organic solvents such as terpenes, and low-viscosity heat curable or photocurable resins can be given.

Preferably a special washing agent is used to remove uncured liquid resins remaining on the surface of a photofabricated product. This special washing agent satisfies two conditions, (I) the washing agent causes a test specimen, obtained by photocuring a liquid resin comprising 50 parts by weight of polypropylene glycol diacrylate shown by the following formula (A),

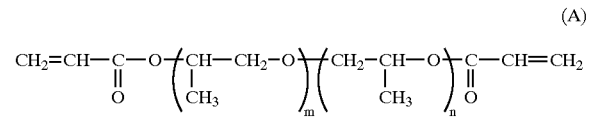
(A)

wherein m+n is 7, 47 parts by weight of methoxytripropylene glycol acrylate shown by the following formula (B),

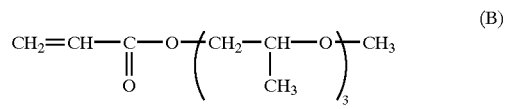
(B)

and 3 parts by weight of 1-hydroxycyclohexyl phenyl ketone as a photoinitiator, to swell at a swelling rate of 10 wt % or less when immersed therein at 23° C. for 12 hours (hereinafter called "condition (I)"), and (II) the washing agent causes the liquid resin to be dissolved or dispersed therein when 5 ml of the liquid resin is added to 30 ml of the washing agent and shaken for one minute (hereinafter called "condition (II)") at ambient temperature.

In a second embodiment of the invention concerning the washing agent, the washing agent comprises a compound of which the three-component Hansen solubility parameter is 27–35 $(MPa)^{1/2}$.

The washing agent may be a single compound or may comprise more than one compound.

In a preferred embodiment, the washing agent according to the present invention used to remove uncured liquid resins remaining on the surface of a photofabricated product comprises at least one compound selected from the group consisting of ethylene glycol, diethylene glycol, triethylene glycol, propylene glycol, dipropylene glycol, tripropylene glycol, and propylene carbonate.

In a preferred embodiment, the washing agent according to the present invention used to remove uncured liquid resins remaining on the surface of a photofabricated product comprises triethylene glycol and/or tripropylene glycol.

A method of washing a photofabricated product according to the present invention comprises removing uncured liquid resins remaining on the surface of the photofabricated product using the washing agent of the present invention.

The washing agent which satisfies the condition (I) is inactive with cured resins obtained by photocuring acrylic liquid resins and causes very little erosion of the cured resins.

Therefore, a photofabricated product made of acrylic cured resins is not deformed due to swelling and the strength thereof does not decrease when the surface of the photofabricated product is washed using the washing agent which satisfies the condition (I).

Acrylic liquid resins are liquid photocurable resins comprising at least one compound containing (meth)acrylic functional groups. Acrylic cured resins are photocured products made from acrylic liquid resins.

The washing agent which satisfies the condition (II) can disperse or dissolve various acrylic liquid resins.

Therefore, acrylic cured resins adhering to a photofabricated product made of acrylic cured resins can be completely removed by washing the surface of the photofabricated product using the washing agent which satisfies the condition (II). Moreover, the photofabricated product is not deformed due to swelling and the strength of the photofabricated product does not decrease.

The compound for which the three-component Hansen solubility parameter is 27–35 $(MPa)^{1/2}$ can dissolve or disperse various acrylic liquid resins. Such a compound is inactive with cured resins obtained by photocuring acrylic liquid resins and causes very little erosion of the cured resins.

The following steps (1) to (3) are procedures for determining whether or not the washing agent satisfies the condition (I) (measurement of swelling rate).

(1) Preparation of Liquid Resin 50 parts by weight of polypropylene glycol diacrylate shown by the above formula (A) ("APG-700" manufactured by Shin-Nakamura Chemical Co., Ltd.), 47 parts by weight of methoxytripropylene glycol acrylate shown by the above formula (B) ("Viscoat 312" manufactured by Osaka Organic Chemical Industry, Ltd.), and 3 parts by weight of 1-hydroxycyclohexyl phenyl ketone ("Irgacure 164" manufactured by Ciba Specialty Chemicals Co., Ltd.) are stirred at 40–50° C. for two hours to prepare a transparent liquid resin (hereinafter may be called "specific liquid resin").

(2) Preparation of Test Specimen

The specific liquid resin obtained in the above (1) is poured into a mold (1 cm×5 cm×0.6 cm) and irradiated with ultraviolet rays at a dose of 6 $J/cm^2$ to prepare a test specimen made of a cured resin. The resulting test specimen feels like rubber (elastomer).

(3) Immersion Test (Measurement of Weight Changes)

After measuring the weight of the test specimen (1 cm×5 cm×0.6 cm) obtained in the above (2), the test specimen is allowed to stand in a sampling tube together with 50 ml of a washing agent to be evaluated at 23° C. for 12 hours.

The test specimen removed from the sampling tube is immersed in ethanol for 30 seconds. The test specimen is then dried using an air gun or the like. After removing the washing agent and ethanol from the surface of the test specimen, the weight of the test specimen is measured.

The swelling rate is calculated from the weight of the test specimen before immersion in the washing agent ($W_g$) and the weight after immersion (W) according to the following formula.

Swelling rate $(\%) = ((W \ldots W_g)/W_g) \times 100$

The swelling rate of the test specimen using the washing agent according to the present invention is less than 10%, and preferably less than 5%

A washing agent which causes swelling of a test specimen obtained from the specific liquid resin (relatively soft cured resin having rubber elasticity) immersed therein at a rate of only less than 10% does not react with cured resins obtained by photocuring acrylic liquid resins and causes very little erosion of the cured resins. Therefore, a photofabricated product comprising acrylic cured resins is not deformed due to swelling and the strength thereof does not decrease when the surface of the photofabricated product is washed using such a washing agent.

The washing agent according to the present invention can dissolve or disperse the specific liquid resin (condition (II)).

The test to determine whether or not the washing agent satisfies the condition (II) is carried out by charging a sampling tube with 30 ml of a washing agent to be evaluated and 5 ml of the specific liquid resin, shaking the sampling tube for one minute, and allowing the solution to stand for ten minutes to determine whether the solution in the sampling tube is in any of the following conditions (1) to (3) by naked eye observation.

(1) The specific liquid resin is dissolved in the washing agent (dissolved)
(2) The specific liquid resin is almost uniformly dispersed in the washing agent (dispersed)
(3) The specific liquid resin and the washing agent are separated (nondispersed)

A washing agent which allows the solution in the sampling tube to be "dissolved" or "dispersed" can completely remove acrylic liquid resins (specific liquid resin and other liquid resins) adhering to the surface of a photofabricated product.

In a second embodiment of the invention of the washing agent, the washing agent comprises one or more compounds of which the three-component Hansen solubility parameter (Hansen parameter) ($\delta_t$) is 27–35 $(MPa)^{1/2}$. The three-component Hansen solubility parameter ($\delta_t$) of such compounds is preferably 27–33 $(MPa)^{1/2}$. The three-component Hansen solubility parameter ($\delta_t$) and the components ($\delta_d$, $\delta_p$, $\delta_h$) of the solubility parameter are applied according to the definitions in the "Handbook of solubility parameters and other cohesion parameters (Allan F. M. Barton, 1983), pp. 153–161".

This ensures that the washing agent according to the present invention causes very little swelling in a photofabricated product (cured resins) and easily dissolves or disperses liquid resins (uncured resins). It the parameter ($\delta_t$) is less than 27 $(MPa)^{1/2}$, a photofabricated product tends to be deformed due to swelling after washing. If the parameter ($\delta_t$) is more than 35 $(MPa)^{1/2}$, the washing agent tends to exhibit impaired washing performance. The three-component Hansen solubility parameter ($\delta_t$) is calculated according to the following formula, $$\delta_t = (\delta_d^2 + \delta_p^2 + \delta_h^2)^{1/2}$$

wherein
$\delta_d$: Dispersible component of solubility parameter
$\delta_p$: Polar component of solubility parameter
$\delta_h$: Hydrogen bond component of solubility parameter In the washing agent of the present invention, the content of the compounds for which the parameter ($\delta_t$) is 27–35 $(MPa)^{1/2}$ is preferably 80 wt % or more, still more preferably 90 wt %, and particularly preferably 100 wt %

Specific Example of Washing Agent

The washing agent according to the present invention preferably comprises a diol compound shown by the formula (2).

Preferably the washing agent according to the present invention comprises a compound shown by the following formula (2):

$$HO-(R^5-O)_p-H \quad (2)$$

wherein $R^5$ represents an alkylene group having 1–10 carbon atoms, excluding $HOCH_2OH$, which is not a chemically stabile compound; p is an integer from 1 to 20, and preferably from 1 to 3.

Examples of alkylene groups represented by $R^5$ are a methylene group, ethylene group, trimethylene group, tetramethylene group, propylene group, butylene group and hexamethylene group.

Specific examples of the compounds shown by the above formula (2) include ethylene glycol, diethylene glycol, triethylene glycol, propylene glycol, dipropylene, glycol, tripropylene glycol, tetraethylene glycol, tetrapropylene glycol, tetramethylene glycol, 3-methyl-1,5-pentanediol, neopentyl glycol, 1,6-hexanediol, 1,4-butanediol and 1,9-nonanediol.

Of these, ethylene glycol, diethylene glycol, triethylene glycol, propylene glycol, dipropylene glycol, tripropylene glycol are preferable, with triethylene glycol and tripropylene glycol being particularly preferable because these two compounds exhibit good washing performance due to excellent dispersibility of uncured resins (liquid resins).

As specific examples of compounds other than the compound shown by the formula (2) used in the washing agent of the present invention, propylene carbonate and the like can be given.

Viscosity (25° C.) of the washing agent of the present invention is preferably 1–5,000 mPa·s, and still more preferably 1–2,000 mPa·s.

There are no specific limitations to any photofabricated product to be washed with the washing agent of the present invention. The washing agent of the present invention is at least effective for washing a photofabricated product comprising acrylic cured resins.

Examples of liquid resins (photocurable resins) used to produce such acrylic cured resins are resins comprising polyester acrylate, epoxy acrylate, polyurethane acrylate, polyether acrylate, and the like. It is preferable to use the washing agent of the present invention to wash a photofabricated product made of a resin comprising a polyurethane acrylate.

Preferably the washing agent of the present invention is used for washing a photofabricated product with rubber elasticity (see Japanese Patent Application No. 97433/1999 and No. 165103/1999), which is comparatively soft and easily deformed due to swelling with the washing agent. The products with rubber elasticity have a high tendency of absorption of washing agent with the disadvantages mentioned before.

Examples of a photofabricated product with rubber elasticity are photofabricated products obtained from the following resin compositions (1) to (6) can be given.

(1) A resin composition of which the cured product obtained by irradiating the composition with activated energy rays has a glass transition temperature of 10° C. or less, preferably 0° C. or less, and still more preferably −5° C. or less.

(2) A resin composition of which the cured product obtained by irradiating the composition with activated energy rays has an elastic deformation working rate of 50% or more, preferably 60% or more, still more preferably 70% or more, and particularly preferably 80% or more.

(3) The resin composition described in the above (1) or (2), which comprises a compound shown by the following formula (a):

$$X-Z-(R^1-Z)_m-(R^2-Z)_n-X \quad (a)$$

wherein each X independently represents an organic group having an ethylenically unsaturated group, $R^1$ and $R^2$ independently represent aliphatic hydrocarbon groups having 2–10 carbon atoms, each Z independently represents an oxygen atom or sulphur atom, m is an integer of 1 or more, n is 0 or an integer of 1 or more, provided that (m+n) is 6 or more, and $-(R^1-Z)-$ and $-(R^2-Z)-$ in the group represented by $-(R^1-Z)_m-(R^2-Z)_n-$ may be bonded either randomly or block-like.

(4) The resin composition described in the above (1) or (2), which comprises a compound shown by the following formula (b):

$$X-Y-Z[-(R^1-Z)_m-(R^2-Z)_n-Y-]_pX \quad (b)$$

wherein each X independently represents organic groups having an ethylenically unsaturated group, $R^1$ and $R^2$ independently represent aliphatic hydrocarbon groups having 2–10 carbon atoms, each Y independently represents divalent organic groups, each Z independently represents an oxygen atom or a sulfur atom, m is an integer of 1 or more, n is 0 or an integer of 1 or more, provided that (m+n) is 6 or more, p is an integer from 1 to 100, and $-(R^1Z)$ and $-(R^2-Z)-$ in the group represented by $-(R^1-Z)_m-(R^2-Z)_n-Y-$ may be bonded either randomly or block-like.

(5) The resin composition described in the above (4), wherein the divalent organic group Y in the compound shown by the formula (b) comprises A urethane bond (—CONH—), and preferably is an urethane (meth) acrylate.

(6) Any of the above compositions also containing a filler dispersed therein. Preferably the filler is selected from the group consisting of glass heads, hollow glass beads, silica particles, potassium titanate whisker, talc, carbon black, and organic fillers dispersed therein.

Sometimes surface smoothness is a very important parameter for three-dimensional objects. In that case it is preferable to wash the surface of the three dimensional object with a heat curable or photocurable resin. For obtaining a smooth surface, postcure by irradiating with heat or light is required. Since not only the resins on the surface of the object but also the uncured resin composition remaining inside the three-dimensional objects can be cured by the postcure, it is also preferable to perform the postcure after washing with organic solvents.

The glass transition temperature of the cured product of the resin composition is determined from a peak (maximum) existing in the measurement temperature range, when applying an oscillation frequency of 3.5 Hz to the cured product and measuring the temperature dependency curve of the loss tangent using a dynamic viscoelasticity measurement device. Specifically, the cured product of the resin composition of the present invention has a peak (maximum) in the measurement temperature range of 10° C. or less.

If two or more peaks equivalent to the glass transition temperature exist in the measurement temperature range, the major glass transition temperature (i.e. glass transition temperature determined from the maximum peak of loss tangent) must be 10° C. or less. It is preferably that all the glass transition temperatures be 10° C. or less.

A cured product having a glass transition temperature of 10° C. or less possesses suitable rubber elasticity. Even if a three-dimensional product consisting of such a cured product is deformed by applying a load, the original shape can be immediately restored.

The elastic deformation working rate of the cured product or the resin composition is measured as follows.

(i) A compressive load of a spherical indenter with a diameter of 0.4 mm (compression rate; 30 μm/min.) is applied to the surface of a film of a cured product (for example, 100 μm thick) at room temperature using a ultra-micro hardness tester "Fischer Scope H-100" (manufactured by Fischer Technology Inc.). The compressive load is released when the compressive strain of the cured product becomes 5% to obtain a "stress-strain curve" shown in FIG. 1.

(ii) In FIG. 1 showing an example of the stress-strain curve, a curve OA shows the relation between the stress and the amount of the strain when applying the compressive load, and a curve AB shows the relation between the stress and the amount of the strain after releasing the compressive load (at the time of restoration). C is the intersection point of a perpendicular line from A and the horizontal axis.

The area enclosed by OAB corresponds to the working amount $W_r$ of plastic deformation, the area enclosed by BAC corresponds to the working amount $W_e$ of elastic deformation, and the area enclosed by OAC corresponds to the total working amount $W_t$.

The elastic deformation working rate is determined by $W_e/W_t=W_e/(W_r+W_e)+$(area enclosed by BAC)/(area enclosed by OAC).

The cured product having an elastic deformation working rate of 50% or more possesses suitable rubber elasticity. Even if a three-dimensional product of the cured product is deformed by applying a load, the original shape can be immediately restored.

Method of Washing

A washing method according to the present invention comprises removing uncured liquid resins remaining on the surface of a photofabricated product using the washing agent of the present invention.

Examples of carrying out the washing method are a method of immersing a photofabricated product in the washing agent of the present invention provided in a container equipped with a supersonic wave oscillator (ultrasonic cleaning), a method for spraying the washing agent of the present invention onto the surface of a rotating photofabricated product placed on a turn table (shower method), and the like.

Furthermore, it is preferable to coat the surface of the three-dimensional object with heat curable or photocurable hard coatings in order to improve the surface hardness and heat resistance of the three-dimensional objects after washing the object. As such hard coating materials, organic coating materials such as an acrylic resin, epoxy resin, and silicone resin or inorganic hard coating materials can be used. These hard coating materials can be used either individually or in combinations of two or more.

The three-dimensional object formed by photocuring the resin composition of the present invention (the three-dimensional object of the present invention) exhibits superior fabrication accuracy, a large modulus of elasticity, a small change of the modulus of elasticity with time, and excellent folding endurance. In addition, the three-dimensional object of the present invention does not contain residual bubbles and exhibits superior external appearance. Therefore, the three-dimensional object of the present invention can be suitably used as mechanical parts, machine housings, and prototypes for such products.

EXAMPLES REGARDING THE EFFECT OF COMPONENT C

Synthesis Example 1

A 1 l reaction vessel equipped with a reflux condenser, stirrer, thermometer, and dropping funnel was charged with 75 g of n-butyl acrylate, 25 g of 2-ethylhexyl acrylate, 4 g of dodecylmercaptan, 1 g of benzoyl peroxide, and 200 g of toluene. The mixture was heated to 75–85° C. A mixture of 75 g of n-butyl acrylate, 25 g of 2-ethylhexyl acrylate, and 1 g of benzoyl peroxide was continuously dropped while stirring the mixture at this temperature to carry out the polymerization reaction for three hours. After the reaction, the solvent and low boiling point matters were removed by evaporation under reduced pressure, thereby obtaining an n-butyl acrylate/2-ethylhexyl acrylate copolymer. This copolymer is designated as "Copolymer (C-1)".

Example 1

According to the formulations of Table 1, a vessel equipped with a stirrer was charged with 30 parts by weight of 3,4-epoxycyclohexylmethyl-3',4'-epoxycyclohexanecarboxylate "UVR-6110" (manufactured by Union Carbide Corp.) as component (A), 25 parts by weight of bis(3,4-epoxycyclohexylmethyl)adipate "UVR-6199" (manufactured by Union Carbide Corp.) as component (A), 10 parts by weight of 1,6-hexanediol diglycidyl ether "Epolite 1600" (manufactured by Kyoeisha Chemical Co., Ltd.) as component (A), 2 parts by weight of triarylsulfonlumhexafluoroantimonate "UVI-6974" (manufactured by Union Carbide Corp.) as component (B), 0.1 part by weight of "Polyflow No. 90" (manufactured by Kyoeisha Chemical Co., Ltd.) as component (C), 13 parts by weight of trimethylolpropane triacrylate "Viscoat 295" (manufactured by Osaka Organic Chemical Industry Co., Ltd.) as component (D), 2 parts by weight of 1-hydroxycyclohexylphenyl ketone "Irgacure 184" (manufactured by Ciba Specialty Chemicals Co., Ltd.) as component (E), 10 parts by weight of PO-modified glycerol "Sunnix GP 400" (manufactured by Sanyo Chemical Industries, Ltd.) as component (F), and 8 parts by weight of core-shell elastomer particles (core: partially crosslinked styrene/butadiene copolymer, shell; methyl methacrylate/glycidyl methacrylate copolymer) produced by emulsion polymerization, having an average particle diameter of 200 nm, as component (G). The mixture was stirred for three hours at 60° C. to obtain a liquid composition (the resin composition of the present invention). Viscosity of the resulting composition at 25° C. measured by using a B-type viscometer was 620 cps.

Example 2

A liquid composition (the resin composition of the present invention) was prepared in the same manner as in Example 1 except for changing the amount of "Polyflow No. 90" (manufactured by Kyoeisha Chemical Co., Ltd.) used as the component (C) to 0.5 part by weight, as shown in Table 1. Viscosity of the resulting composition at 25° C. measured by using a B-type viscometer was 620 cps.

Example 3

A liquid composition (the resin composition of the present invention) was prepared in the same manner as in Example 1 except for changing the amount of "Polyflow No. 90" (manufactured by Kyoeisha Chemical Co., Ltd.) used as the component (C) to 1.0 part by weight, as shown in Table 1. Viscosity of the resulting composition at 25° C. measured by using a B-type viscometer was 620 cps.

Example 4

According to the formulations of Table 1, a vessel equipped with a stirrer was charged with 30 parts by weight of 1,4-bis[(3-ethyl-3-oxetanylmethoxy)methyl]benzene as component (A), 30 parts by weight of 3,4-epoxycyclohexylmethyl-3',4'-epoxycyclohexanecarboxylate "UVR-6110" (manufactured by Union Carbide Corp.) as component (A), 15 parts by weight of bis(3,4-epoxycyclohexylmethyl)adipate "UVR-6199" (manufactured by Union Carbide Corp.) as component (A), 15 parts by weight of 1,6-hexanediol diglycidyl ether "Epolite 1600" (manufactured by Kyoeisha Chemical Co., Ltd.) as component (A), 2 parts by weight of triarylsulfoniumhexafluoroantimonate "UVI-6974" (manufactured by Union Carbide Corp.) as component (B), 0.5 part by weight of "Polyflow No. 90" (manufactured by Kyoeisha Chemical Co., Ltd.) as component (C), and 8 parts by weight of core-shell elastomer particles (core: partially crosslinked styrene/butadiene copolymer, shell; methyl methacrylate/glycidyl methacrylate copolymer) produced by emulsion polymerization, having an average particle diameter of 200 nm, as component (G). The mixture was stirred for three hours at 60° C. to obtain a liquid composition (the resin composition of the present invention). Viscosity of the resulting composition at 25° C. measured by using a B-type viscometer was 580 cps.

Example 5

A liquid composition (the resin composition of the present invention) was prepared in the same manner as in Example 1 except for using 0.5 parts by weight of the copolymer (C-1) prepared in Synthesis Example 1 instead of "Polyflow No. 90" (manufactured by Kyoeisha Chemical Co., Ltd.) as the component (C), as shown in Table 1. Viscosity of the resulting composition at 25° C. measured by using a B-type viscometer was 620 cps.

Comparative Example 1

A liquid composition (a comparative resin composition) was prepared in the same manner as in Example 1, except that "Polyflow No. 90" (manufactured by Kyoeisha Chemical Co., Ltd.) as the component (C) was not added, as shown in Table 1. Viscosity of the resulting composition at 25° C. measured by using a B-type viscometer was 620 cps.

Comparative Example 2

A liquid composition (a comparative resin composition) was prepared in the same manner as in Example 4, except that "Polyflow No. 90" (manufactured by Kyoeisha Chemical Co., Ltd.) as the component (C) was not added, as shown in Table 1. Viscosity of the resulting composition at 25° C. measured by using a B-type viscometer was 580 cps.

Comparative Example 3

A liquid composition (a comparative resin composition) was prepared in the same manner as in Example 1 except that 0.1 part by weight of a silicone-type defoaming agent "Polyflow ATF" (manufactures by Kyoeisha Chemical Co., Ltd.) was added instead of the "Polyflow No. 90" (manufactured by Kyoeisha Chemical Co., Ltd.) as the component (C), as shown in Table 1. Viscosity of the resulting composition at 25° C. measured by using a B-type viscometer was 620 cps.

Comparative Example 4

A liquid composition (a comparative resin composition) was prepared in the same manner as in Example 4 except that 0.1 part by weight of a acrylic fiber/vinyl ether defoaming agent "Flowlen AC326F" (manufactured by Kyoeisha Chemical Co., Ltd.) was added instead of the "Polyflow No. 90" (manufactured by Kyoeisha Chemical Co., Ltd.) as the component (C), as shown in Table 1. Viscosity of the resulting composition at 25° C. measured by using B-type viscometer was 580 cps.

Comparative Example 5

A liquid composition (a comparative resin composition) was prepared in the same manner as in Example 1 except that 0.1 part by weight of a defoaming agent "MEGAFAC F-179" (manufactured by Dainippon Ink and Chemicals, Inc.) was added instead of the "Polyflow No. 90" (manufactured by Kyoeisha Chemical Co., Ltd.) as the component (C), as shown in Table 1. Viscosity of the resulting composition at 25° C. measured by using a B-type viscometer was 620 cps.

TABLE 1

| | | Example | | | | | Comparative Example | | | | |
|---|---|---|---|---|---|---|---|---|---|---|---|
| | | 1 | 2 | 3 | 4 | 5 | 1 | 2 | 3 | 4 | 5 |
| (A) | 3,4-Epoxcyclohexylmethyl-3',4'-epoxycyclohexanecarboxylate[1] | 30.0 | 30.0 | 30.0 | 30.0 | 30.0 | 30.0 | 30.0 | 30.0 | 30.0 | 30.0 |
| (A) | 1,4-Bis[(3-ethyl-3-oxelanylmethoxylmethyl]benzene | | | | 30.0 | | | 30.0 | | 30.0 | |
| (A) | Bis(3,4-epoxycyclohexylmethyl)adipate[2] | 25.0 | 25.0 | 25.0 | 15.0 | 25.0 | 25.0 | 15.0 | 25.0 | 15.0 | 25.0 |
| (A) | 1,6-Hexanediol diglycidyl ether[3] | 10.0 | 10.0 | 10.0 | 15.0 | 10.0 | 10.0 | 15.0 | 10.0 | 15.0 | 10.0 |
| (B) | Triarylsulfoniumhexafluoroantimonate[4] | 2.0 | 2.0 | 2.0 | 2.0 | 2.0 | 2.0 | 2.0 | 2.0 | 2.0 | 2.0 |
| (C) | Alkyl acrylate-based copolymer "Polyflow No. 90" (manafactured by Kyoeisha Chemical Co. Ltd.) | 0.1 | 0.5 | 0.1 | 0.5 | | | | | | |
| (C) | Copolymer (C-1) | | | | | 0.5 | | | | | |
| — | Silicone defoaming agent[5] | | | | | | | | 0.1 | | |
| — | Vinyl ether defoaming agent[6] | | | | | | | | | 0.1 | |
| — | Fluoropolymer defoaming agent[7] | | | | | | | | | | 0.1 |
| (D) | Trimethylolpropane triacrylate[8] | 13.0 | 13.0 | 13.0 | | 13.0 | 13.0 | | 13.0 | | 13.0 |
| (E) | 1-Hydroxycyclohexylphenyl ketone[9] | 2.0 | 2.0 | 2.0 | | 2.0 | 2.0 | | 2.0 | | 2.0 |
| (F) | PO-modified glycerol[10] | 10.0 | 10.0 | 10.0 | | 10.0 | 10.0 | | 10.0 | | 10.0 |

TABLE 1-continued

|  | Example | | | | | Comparative Example | | | | |
| --- | --- | --- | --- | --- | --- | --- | --- | --- | --- | --- |
|  | 1 | 2 | 3 | 4 | 5 | 1 | 2 | 3 | 4 | 5 |
| (G) Core-shell type elastomer particles (average particles diameter: 200 nm)[11] | 8.0 | 8.0 | 8.0 | 8.0 | 8.0 | 8.0 | 8.0 | 8.0 | 8.0 | 8.0 |

[1] UVR-6110 (manufactured by Union Carbide Corp.)
[2] UVR-6199 (manufactured by Union Carbide Corp.)
[3] Epolite 1600 (manufactured by Kyoeisha Chemical Co., Ltd.)
[4] UVI-6974 (manufactured by Union Carbide Corp.)
[5] Polyflow ATF (manufactured by Kyoeisha Chemical Co., Ltd.)
[6] Flowlen AC326F (manufactured by Kyoeisha Chemical Co., Ltd.)
[7] "MEGAFAC F-179" (manufactured by Dainippon Ink and Chemicals, Inc.)
[8] Viscoat 295 (manufactured by Osaka Organic Chemical Industry Co., Ltd.)
[9] Irgacure 184 (manufactured by Ciba Speciality Chemicals Co., Ltd.)
[10] Sunnix GP 400 (manufactured by Sanyo Chemical Industries, Ltd.)
[11] Elastomer particles produced by emulsion polymerization (core; partially crosslinked styrene/butadiene copolymer, shell: methyl methacrylate/glycidyl methacrylate)

Evaluation

The resin compositions prepared in Examples 1–5 and Comparative Examples 1–5 were evaluated in terms of the following items (1)–(3). The results are shown in Table 2.

TABLE 2

|  | Example | | | | | Comparative Example | | | | |
| --- | --- | --- | --- | --- | --- | --- | --- | --- | --- | --- |
|  | 1 | 2 | 3 | 4 | 5 | 1 | 2 | 3 | 4 | 5 |
| Deforming time (sec) | 20 | 5 | 5 | 5 | 5 | >18000 | >18000 | 1200 | 900 | >18000 |
| Coating properties (repelling) | None | None | None | None | None | None | None | Repelling | Repelling | None |
| Formability *Inadequate fabrication due to repelling | None | None | None | None | None | None | None | Repelling | Repelling | None |
|  | None | None | None | None | None | Bubbles | Bubbles | None | None | Bubbles |
| * Bubbles in the fabricated object<br>* Number of bubbles | — | — | — | — | — | 34 | 28 | — | — | 22 |

(1) Defoaming Properties (Defoaming Time)

Bubbles were produced in 20 g of a resin composition in a 30 cc sample tube made of glass by injecting 10 μl of air through a microsyringe needle inserted into the resin composition. The resin composition was allowed to stand at 23° C. and 50% RH to measure the period of time required for the bubbles to disappear.

(2) Coating Properties

The resin composition was applied to the surface (100 mm×100 mm) of a photocured resin layer made from the same resin composition to observe the presence or absence of repellence (uneven coating) on the coated surface. The resin composition was coated using an applicator with a gap width of 0.38 mm.

(3) Formability

A three-dimensional object (a box) shown in FIG. 2, wherein numerals indicate dimensions, was formed using a photofabricator "Solid Creator SCS 300P" manufactured by Sony Corp. to confirm the presence or absence of inadequate fabrication (unacceptable appearance) due to uneven coating (repellence) by observation of the external appearance. The presence or absence of bubbles remaining in the three-dimensional object was also confirmed. When residual bubbles were found, the number of bubbles was counted.

Fabrication Conditions (i) Laser: Semiconductor excitating solid laser (wavelength: 355 nm)
(ii) Intensity of laser beam at the liquid surface: 100 mW
(iii) Thickness of cured resin layer: 0.2 mm
(iv) Scanning speed, optimum scanning speed at which the cure depth of each composition was 0.3 mm Examples of Suitable Washing Agents The invention of preferred washing agents will be described by examples, which should not be construed as limiting the invention.

Organic solvents shown in Table 3 were subjected to a test to determine whether or not the organic solvents satisfied the condition (I) (measurement of swelling rate of immersed test specimen), and a test to determine whether or not the organic solvents satisfied the condition (II) (observation of the condition of solution in sampling tube). The results are shown in Table 3 together with the three-component Hansen solubility parameter. The three-component Hansen solubility parameter ($\delta_t$) and the components ($\delta_d$, $\delta_p$, $\delta_h$) of the solubility parameter have been retrieved according to "Handbook of solubility parameters and other cohesion parameters (Allan F. M. Barton. 1963), pp. 153–161".

TABLE 3

| Solvent | Hansen parameter ($\delta_t$) and its components ((MPa)$^{1/2}$) | | | | Condition (I) Swelling rate (%) | Condition (II) Condition of solution | Washing agent |
|---|---|---|---|---|---|---|---|
| | $\delta_t$ | $\delta_d$ | $\delta_p$ | $\delta_h$ | | | |
| Water | 48 | 12.3 | 31.3 | 34.2 | 2.8 | Nondispersed | Comparison |
| Glycerol | 36.1 | 17.4 | 12.1 | 29.3 | 2.1 | Nondispersed | Comparison |
| Ethylene glycol | 32.9 | 17 | 11 | 26 | 1.8 | Dispersed | Invention |
| Dipropylene glycol | 31.7 | 16 | 20.3 | 18.4 | 1.7 | Dispersed | Invention |
| Propylene glycol | 30.2 | 16.8 | 9.4 | 23.3 | 1.6 | Dispersed | Invention |
| Diethylene glycol | 29.9 | 16.2 | 14.7 | 20.5 | 1.6 | Dispersed | Invention |
| Triethylene glycol | 27.5 | 16 | 12.5 | 18.6 | 2.1 | Dissolved | Invention |
| Propylene carbonate | 27.3 | 20.1 | 18 | 4.1 | 8.6 | Dissolved | Invention |
| Trioropylene glycol | — | — | — | — | 3.2 | Dissolved | Invention |
| Ethyl alcohol | 26.5 | 15.8 | 8.8 | 19.4 | 32.1 | Dissolved | Comparison |
| Isopropyl alcohol | 24.5 | 16 | 6.8 | 17.4 | 19.9 | Dissolved | Comparison |
| Ethyl lactate | 21.6 | 16 | 7.6 | 12.5 | 41.9 | Dissolved | Comparison |
| Acetone | 21.1 | 156 | 12.3 | 7 | 51.5 | Dissolved | Comparison |
| Methyl ethyl ketone | 19.1 | 16 | 9 | 5.1 | 58.7 | Dissolved | Comparison |
| Propylene glycol methyl ether | — | — | — | — | 42.3 | Dissolved | Comparison |
| Methoxypropylene glycol acetate | — | — | — | — | 51.8 | Dissolved | Comparison |
| Ethoxyethyl propionate | — | — | — | — | 58.5 | Dissolved | Comparison |

Photofabricated products to be washed were prepared according to the following Fabrication Example 1 (soft) and Fabrication Example 2 (hard).

Fabrication Example 1

A box 1 and a lid 2 shown in FIG. 2 were fabricated from a polyurethane acrylate photocurable resin ("SCR330" manufactured by JSR Corporation) using a photofabrication apparatus ("Solid Creator JSC-2000" manufactured by SONY Corp.) under the following fabrication conditions. The resulting photofabricated products felt like rubber (elastomer).

Fabrication Conditions (i) Laser beam intensity at liquid surface: 100 mW
(ii) Scanning speed: optimum scanning speed at which cure depth of each composition was 0.3 mm
(iii) Thickness of cured resin layer: 0.2 mm Fabrication Example 2

A box 1 and a lid 2 (hard photofabricated products) shown in FIG. 2 were fabricated in the same manner as in Fabrication Example 1 except for using a polyurethane acrylate photocurable resin ("SCR610" manufactured by JSR Corporation).

Examples 6–12 and Comparative Examples 6–15

Each washing agent of the present invention (7 types) and each washing agent for comparison (10 types) was filled into a container equipped with a supersonic wave oscillator. The photofabricated products (box 1 and lid 2) with rubber elasticity obtained in Fabrication Example 1 were immersed in the washing agent in the container for 12 hours. The photofabricated products were washed in the washing agent by ultrasonic cleaning for 30 minutes, and were then dried using an air gun.

The washing performance of the washing agents was evaluated by observing the liquid resins remaining on the surfaces of the washed and dried photofabricated products with the naked eye. The case where the liquid resin adhering to the surface of the photofabricated product was completely removed was evaluated as "Excellent". The case where a small amount or the liquid resins remaining was easily removed using a spatula, brush, or the like was evaluated as "Good". The case where almost all the liquid resins adhering to the surface of the photofabricated products remained on the surface after washing and the washing performance of the washing agent was scarcely recognized was evaluated as "Bad".

The presence or absence of deformation of the thin portion of the washed and dried photofabricated products was evaluated by confirming whether or not the lid 2 fit the opening of the box 1.

The results of the evaluations are shown in Table 4.

TABLE 4

| | Type of washing agent | | Washing performance | Deformation |
|---|---|---|---|---|
| Comparative Example 6 | Washing agent for comparison | Water | Bad | None |
| Comparative Example 7 | | Glycerol | Bad | None |
| Example 6 | Washing agent of the present Invention | Ethylene glycol | Good | None |
| Example 7 | | Dioropylene glycol | Good | None |
| Example 8 | | Propylene glycol | Good | None |
| Example 9 | | Diethylene glycol | Good | None |
| Example 10 | | Triethylene glycol | Excellent | None |
| Example 11 | | Propylene carbonate | Good | None |
| Example 12 | | Tripropylene glycol | Excellent | None |

TABLE 4-continued

|  |  | Type of washing agent | Washing performance | Deformation |
|---|---|---|---|---|
| Comparative Example 8 | Washing agent for comparison | Ethyl alcohol | Excellent | Observed |
| Comparative Example 9 |  | Isopropyl alcohol | Excellent | Observed |
| Comparative Example 10 |  | Ethyl lactate | Excellent | Observed |
| Comparative Example 11 |  | Acetone | Excellent | Observed |
| Comparative Example 12 |  | Methyl ethyl ketone | Excellent | Observed |
| Comparative Example 13 |  | Propylene glycol methyl ether | Excellent | Observed |
| Comparative Example 14 |  | Methoxypropylene glycol acetate | Excellent | Observed |
| Comparative Example 15 |  | Ethoxyethyl propionate | Excellent | Observed |

Examples 13–19 and Comparative Example 16–25

Each washing agent of the present invention (7 types) and each washing agent for comparison (10 types) was filled into a container equipped with a supersonic wave oscillator. The hard photofabricated products (box 1 and lid 2) obtained in Fabrication Example 2 were immersed in the washing agent in the container for 12 hours. The photofabricated products were washed in the washing agent by ultrasonic cleaning for 30 minutes, and were then dried using an air gun. The washing performance of the washing agents was evaluated by observing the liquid resin remaining on the surface of the washed and dried photofabricated products with the naked eye. The presence or absence of deformation of the thin portion of the washed and dried photofabricated products was evaluated by confirming whether or not the lid 2 fit the opening of the box 1. The same ratings apply as in Examples 6–12.

The results of the above evaluations are shown in Table 5.

Examples Showing the Effect of Water

The invention of adding water to the composition will now be described by way of examples, which should not be construed as limiting the invention. In the examples, "part" and "%" respectively refer to "parts by weight" and "wt %" unless otherwise indicated.

Example 13

A 10 l separable flask equipped with a stirrer was charged with the components shown in Table 6, that is, 3000 g (30 parts) of 1,4-bis[(3-ethyl-3-oxetanylmethoxy)methyl]benzene, 4000 g (40 parts) of 3,4-epoxycyclohexylmethyl-3',4'-epoxycyclohexanecarboxylate, 1000 g (10 parts) of 1,6-hexanediol diglycidyl ether, and 1000 g (10 parts) of epoxy-modified polybutadiene "Epolead PB3600" (manufactured by Daicel Chemical Industries, Ltd.), 100 g (1 part) of a triallylsulfonium hexafluoroantimonate "UVI-6974" (manufactured by Union Carbide Corp.), 900 g (9

TABLE 5

|  |  | Type of washing agent | Washing performance | Deformation |
|---|---|---|---|---|
| Comparative Example 16 | Washing agent for comparison | Water | Bad | None |
| Comparative Example 17 |  | Glycerol | Bad | None |
| Example 13 | Washing agent of the present invention | Ethylene glycol | Good | None |
| Example 14 |  | Dipropylene glycol | Good | None |
| Example 15 |  | Propylene glycol | Good | None |
| Example 16 |  | Diethylene glycol | Good | None |
| Example 17 |  | Triethylene glycol | Excellent | None |
| Example 18 |  | Propylene carborate | Good | None |
| Example 19 |  | Tripropylene glycol | Excellent | None |
| Comparative Example 18 | Washing agent for comparison | Ethyl alcohol | Excellent | Observed |
| Comparative Example 19 |  | Isopropyl alcohol | Excellent | Observed |
| Comparative Example 20 |  | Ethyl lactate | Excellent | Observed |
| Comparative Example 21 |  | Acetone | Excellent | Observed |
| Comparative Example 22 |  | Methyl ethyl ketone | Excellent | Observed |
| Comparative Example 23 |  | Propylene glycol methyl ether | Excellent | Observed |
| Comparative Example 24 |  | Methoxypropylene glycol acetate | Excellent | Observed |
| Comparative Example 25 |  | Ethoxyethyl propionate | Excellent | Observed | parts) of core/shell-type elastomer particles "Reginous bond RKB" (manufactured by Reginous Chemical Industries Co., Ltd.) with a number average particle diameter of 200 nm, which are made by coating core particles of a partially cross-linking styrene/butadione copolymer with a coating layer (shell) of a methyl methacrylate/glycidyl methacrylate copolymer. The mixture was stirred at 60° C. for 3 hours. The reaction system was allowed to cool to 26° C. and 60 g (0.6 part) of water was added. The mixture was then stirred for two hours at 25° C. The mixture thus obtained was filtered and the filtrate was subjected to defoaming treatment under reduced pressure to obtain a photocurable resin composition.

The water content of the photocurable resin composition measured by the Karl Fischer method immediately after the preparation was 0.68%, which corresponds to 1.0 time the equilibrium moisture content at 23° C. and 50% relative humidity.

The determination of the water content by the Karl Fischer method was carried out using "AQ-7", a Karl Fischer small quantity water measurement apparatus, "Aqualite RS" as an electrolyte, and "Aqualite CN" as a counter electrode solution (all manufactured by Hiranuma Industry Co., Ltd.).

Example 14

A photocurable resin composition of the present invention was prepared in the same manner as in Example 3 except that the amount of the 1,4-bis[(3-ethyl-3-oxetanylmethoxy) methyl]benzene was changed to 5000 g (50 parts), the amount of 3,4-epoxycyclohexylmethyl-3',4'-epoxycyclohexanecarboxylate was changed to 2900 g (29 parts), and the core shell type elastomeric particles ware not used, as shown in Table 6.

The water content of the resulting photocurable resin composition measured by the Karl Fischer method immediately after the preparation was 0.69%.

Comparative Example 20

A photocurable resin composition for comparison was prepared in the same manner as in Example 21 except for changing the amount of the UVI 6974 to 200 g (2 parts) and the core shell elastomeric particle to 800 g (8 parts), and not adding distilled water, as shown in Table 6.

The water content of the photocurable resin composition measured by the Karl Fischer method immediately after the preparation was 0.08%, which corresponds to 0.1 time the equilibrium moisture content at 23° C. and 50% relative humidity.

Comparative Example 21

A photocurable resin composition for comparison was prepared in the same manner as in Example 20 except for changing the amount of distilled water to 300 g (3 parts), as shown in Table 6.

The water content of the photocurable resin composition measured by the Karl Fischer method immediately after the preparation was 3.01%. which corresponds to 4.6 times the equilibrium moisture content at 23° C. and 50% relative humidity.

Evaluation of the Resin Composition

The resin compositions prepared in Examples 13–14 and Comparative Examples 20–21 were stored under certain constant conditions to evaluate the cure depth before and after storing.

In addition, three-dimensional objects were fabricated using the resin compositions before and after storing to evaluate interlayer adhesion strength and fabrication accuracy in the direction of laminated layers. The measuring methods and evaluation methods used were as follows.

Storing conditions of 23° C. and 50%RH for 60 days were applied to the resin compositions of Example 13 and Comparative Example 20, and storing conditions of 23° C. and 20%RH for 60 days were applied to the resin compositions of Example 14 and Comparative Example 21. An open mouth container with a width of 32 cm, length of 43 cm, and depth of 6.5 cm, attached to a photofabrication apparatus "Solid Creator SCS-1000HD" (manufactured by Sony Corp.), was used as the container for storing the resin compositions.

Storing was started from the date on which the resin compositions were prepared.

(1) Method of Measuring Cure Depth

Using a photofabrication apparatus "Solid Creator SCS-1000HD" (manufactured by Sony Corp.) equipped with an open mouth container (width 32 cm, length 43 cm, depth 6.5 cm) and a He-Cd laser as a light source (wavelength: 325 nm), the liquid surface of the resin composition was irradiated with laser beams (a laser spot diameter, 100 μm; a laser power, 10 mW) at a scanning speed shown in Table 6 (200 mm/s for the resin compositions of Examples 13–14 and Comparative Example 20, 160 mm/s for the resin composition of Comparative Example 21) to form cure layers having a wedge form section for evaluation of the cure depth.

(2) Measurement of Interlayer Adhesion of Three-dimensional Objects

The photocurable resin composition was selectively irradiated using a photofabrication apparatus "Solid Creator SCS 1000HD" (manufactured by Sony Corp.) with laser beams (a laser spot diameter, 100 μM; a laser power, 10 mW) at a scanning speed shown in Table 6 to form a cured resin layer with a thickness of 100 μm. This procedure of forming a cured resin layer was repeated to fabricate a three-dimensional object shown in FIG. 3.

The three-dimensional object thus fabricated was removed from the photofabrication apparatus. The resin composition attached to the surface of was wiped off and an excess resin composition was removed by washing with a terpene solvent. A side (laminated cross-section) of the three-dimensional object was observed to examine occurrence of interlayer peeling. Samples with no interlayer peeling were rated as "AAA" and those with interlayer peeling observed part of or all over the side were rated as "BBB".

(3) Evaluation of Fabrication Accuracy of Three-dimensional Objects

The presence or absence of excessive cured parts, which are not in accord with the design data and should not be produced, under overhang portions (A and B in FIG. 3) of the three-dimensional object was observed. Samples having a smooth back surface in the overhang portions with no excessive cured parts were rated as "AAA" and those having impaired smoothness on the back surface due to excessive cured parts were rated as "BBB".

The measurement and evaluation were performed under the same conditions as the above conditions under which the resin compositions were stored (23° C., 50%RH).

The results are shown in Table 6 together with the water content of the resin compositions before and after stonng (0 days, 60 days).

TABLE 6

| | Example | | Comparative Example | |
|---|---|---|---|---|
| | 13 | 14 | 20 | 21 |
| Component(A)(parts) | | | | |
| 1,4-Bis[(3-ethyl-3-oxetanylmethoxy)methyl]benzene | 30 | 50 | 30 | 30 |
| Component(B)(parts) | | | | |
| 3,4-Epoxycyclohexylmethyl-3',4'-epoxy-cyclohexanecarboxylate | 40 | 29 | 40 | 40 |
| 1,6-Hexanediol diglycidyl ether | | | | |
| Epoxy-modified polybutadiene "Epolead PB3600"(Daioel Chemical Industries, Ltd.) | 10 | 10 | 10 | 10 |
| | 10 | 10 | 10 | 10 |
| Components(C)(parts) | | | | |
| Triallylsulfonium hexafuoroant monate "UVI-6974"(Union Carbide Corp.) | 1 | 1 | 2 | 1 |
| Component(D)(parts) | | | | |
| Elastomer particles "Reginous bond RKB"(Reginous Chemical Industries Co., Ltd.; number average particle diameter, 200 nm) | 9 | — | 8 | 9 |
| Component(E)(parts) | | | | |
| Distilled water | 0.6 | 0.6 | — | 3 |
| Storing conditions (Temperature and RH) | 23° C., 50% | 23° C., 20% | 23° C., 50% | 23° C., 20% |
| Period of storing (Days) | 0   60 | 0   60 | 0   60 | 0   60 |
| Water content (%) | 0.68   0.72 | 0.69   0.53 | 0.08   0.52 | 3.01   1.13 |
| Scanning speed (mm/s) | 200   200 | 200   200 | 200   200 | 160   160 |
| Cure depth (Dm) | 50   150 | 150   150 | 150   125 | 150   220 |
| Change in cure depth (after storing before storing) (%) | 100 | 100 | 83 | 140 |
| Interlayer adhesion | AAA   AAA | AAA   AAA | AAA   BBB | AAA   AAA |
| Fabrication accuracy in the lamination layer direction | AAA   AAA | AAA   AAA | AAA   AAA | AAA   BBB |

As shown in Table 6, the resin compositions obtained in Examples 13 and 14 exhibited almost no change in the water content before and after storing, and also no change in the cure depth. In addition, three-dimensional objects with superior interlayer adhesion and fabrication accuracy were formed from the resin compositions of Examples 13 and 14 before and after storing when fabricated under the same irradiation conditions (scanning speed).

On the other hand, the resin composition obtained in Comparative Example 20 with a small water content of 0.08 wt % immediately after preparation exhibited a significant increase in the water content after storing. The cure depth greatly decreased from 150 μm to 125 μm. As a result, the three-dimensional object fabricated from the resin composition of Comparative Example 20 after storing showed poor interlayer adhesion.

The resin composition obtained in Comparative Example 21 with a large water content of 3.01 wt % immediately after preparation exhibited a significant decrease in the water content after storing. The cure depth greatly increased from 150 μm to 220 μm. As a result, the three-dimensional object fabricated from the resin composition of Comparative Example 21 showed poor fabrication accuracy in the lamination layer direction after storing.

To obtain a three-dimensional object with superior interlayer adhesion and fabrication accuracy from the resin compositions of Comparative Examples 20 and 21, irradiation conditions must be changed each time photofabrication is carried out during storing. This is troublesome and not realistic.

What is claimed is:

1. A process for making three dimensional objects from successive layers of a photocurable composition comprising the steps of (a) forming a layer of photocurable resin composition; (b) curing at least a portion of the layer by exposure to radiation; (c) introducing a new layer of resin composition onto the layer previously exposed to the radiation; (d) repeating steps (b) and (c) until a three dimensional object is formed and (e) washing the object with a washing agent, whereby the washing agent satisfies two conditions;

(I) the washing agent causes a test specimen, obtained by photocuring a liquid resin comprising 50 parts by weight of polypropylene glycol diacrylate shown by the following formula (A),

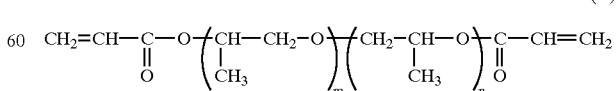

(A)

wherein m+n is 7, 47 parts by weight of methoxytripropylene glycol acrylate shown by the following formula (B),

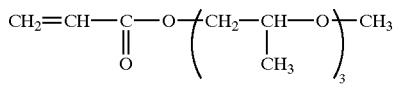 (B)

and 3 parts by weight of 1-hydroxycyclohexyl phenyl ketone as a photoinitiator, to swell at a swelling rate of 10 wt % or less when immersed therein at 23° C. for 12 hours, and (II) the washing agent causes the liquid resin to be dissolved or dispersed therein when 5 ml of the liquid resin is added to 30 ml of the washing agent and shaken for one minute at ambient temperature.

2. The process according to claim 1, wherein the washing agent comprises at least one compound selected from the group consisting of ethylene glycol, diethylene glycol, triethylene glycol, propylene glycol, dipropylene glycol, tripropylene glycol, and propylene carbonate.

3. The process according to claim 2, wherein said photocurable resin composition comprises a filler.

4. The process according to claim 1, wherein said photocurable resin composition comprises a filler.

5. A process for making three dimensional objects from successive layers of a photocurable composition comprising the steps of (a) forming a layer of photocurable resin composition; (b) curing at least a portion of the layer by exposure to radiation; (c) introducing a new layer of resin composition onto the layer previously exposed to the radiation; (d) repeating steps (b) and (c) until a three dimensional object is formed and (e) washing the object with a washing agent, whereby the washing agent comprises a compound of which the three-component Hansen solubility parameter is 27–35 $(MPa)^{1/2}$.

6. The process according to claim 5, wherein the washing agent comprises at least one compound selected from the group consisting of ethylene glycol, diethylene glycol, triethylene glycol, propylene glycol, dipropylene glycol, tripropylene glycol, and propylene carbonate.

7. The process according to claim 6, wherein said photocurable resin composition comprises a filler.

8. The process according to claim 5, wherein said photocurable resin composition comprises a filler.

9. A process for making three dimensional objects from successive layers of a photocurable composition comprising the steps of (a) forming a layer of photocurable resin composition; (b) curing at least a portion of the layer by exposure to radiation, (c) introducing a new layer of resin composition onto the layer previously exposed to the radiation; (d) repeating steps (b) and (c) until a three dimensional object is formed and (e) washing the object with a washing agent, whereby the washing agent comprises a compound shown by the formula:

$$HO-(R^5-O)_p-H$$

wherein $R^5$ represents an alkylene group having 1–10 carbon atoms and p is an integer from 1 to 20, excluding $HOCH_2OH$.

10. The process according to claim 9, wherein the washing agent comprises at least one compound selected from the group consisting of ethylene glycol, diethylene glycol, triethylene glycol, propylene glycol, dipropylene glycol, tripropylene glycol, and propylene carbonate.

11. The process according to claim 10, wherein said photocurable resin composition comprises a filler.

12. The process according to claim 9, wherein said photocurable resin composition comprises a filler.

13. The process according to claim 1, wherein the washing agent comprises triethylene glycol.

14. The process according to claim 1, wherein the washing agent comprises tripropylene glycol.

* * * * *